United States Patent
Hirosaki

(10) Patent No.: US 8,142,685 B2
(45) Date of Patent: Mar. 27, 2012

(54) FLUORESCENT MATERIAL, PROCESS FOR PRODUCING THE SAME, AND LUMINESCENT DEVICE

(75) Inventor: Naoto Hirosaki, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 459 days.

(21) Appl. No.: 12/522,540

(22) PCT Filed: Jan. 11, 2008

(86) PCT No.: PCT/JP2008/050258
§ 371 (c)(1),
(2), (4) Date: Jul. 8, 2009

(87) PCT Pub. No.: WO2008/084848
PCT Pub. Date: Jul. 17, 2008

(65) Prior Publication Data
US 2010/0039020 A1    Feb. 18, 2010

(30) Foreign Application Priority Data

Jan. 12, 2007 (JP) .................. 2007-004628

(51) Int. Cl.
C09K 11/64 (2006.01)
H01J 1/63 (2006.01)
H01J 11/02 (2011.01)
H01J 29/20 (2006.01)

(52) U.S. Cl. .... 252/301.4 R; 252/301.4 F; 252/301.6 F; 252/301.6 R; 313/503; 313/463; 313/467; 313/486; 313/582; 313/584

(58) Field of Classification Search ........... 252/301.4 R, 252/301.4 F, 301.6 R, 301.6 F; 313/503, 313/467, 486, 582, 584, 463
See application file for complete search history.

(56) References Cited

U.S. PATENT DOCUMENTS 7,431,864 B2 * 10/2008 Hirosaki ............... 252/301.4 R
2003/0030368 A1    2/2003 Ellens et al.
(Continued)

FOREIGN PATENT DOCUMENTS

EP    0 155 047 A1    9/1985
(Continued)

OTHER PUBLICATIONS

Caldwell et al., Visible Luminescent Activation of Amorphous AlN:Eu Thin-Film Phosphors with Oxygen, MRS Internet Journal Nitride Semconductor Research, 2001, pp. 1-5,6-13, The Materials Research Society, United States.

(Continued)

Primary Examiner — Carol M Koslow
(74) Attorney, Agent, or Firm — Trojan Law Offices

(57) ABSTRACT

A blue fluorescent material having excellent durability and a high luminance, especially one emitting a high-luminance light by the action of electron rays. The fluorescent material comprises inorganic crystals having a crystal structure which is an AlN crystalline, AlN polycrystalline, or AlN solid-solution crystalline structure. It is characterized in that the inorganic crystals contain at least europium in solution and have an oxygen content of 0.4 mass % or lower and that the fluorescent material emits fluorescence derived from divalent europium ions upon irradiation with an excitation source. More preferably, the fluorescent material contains a given metallic element and silicon. Also provided are a process for producing the fluorescent material and an illuminator including the blue fluorescent material.

15 Claims, 5 Drawing Sheets

U.S. PATENT DOCUMENTS

| | | |
|---|---|---|
| 2006/0061263 A1 | 3/2006 | Sakuma et al. |
| 2006/0220047 A1 | 10/2006 | Nagatomi et al. |
| 2006/0220520 A1 | 10/2006 | Sakane et al. |
| 2006/0226764 A1* | 10/2006 | Tamura et al. ............ 313/495 |
| 2006/0290269 A1 | 12/2006 | Fukuda et al. |
| 2007/0007494 A1 | 1/2007 | Hirosaki |
| 2007/0018567 A1 | 1/2007 | Hirosaki |
| 2007/0108896 A1 | 5/2007 | Hirosaki |
| 2007/0257231 A1 | 11/2007 | Hirosaki |
| 2008/0197321 A1 | 8/2008 | Hirosaki et al. |
| 2009/0026915 A1 | 1/2009 | Nagatomi et al. |
| 2009/0085464 A1 | 4/2009 | Oguma et al. |
| 2009/0129052 A1 | 5/2009 | Hirosaki |
| 2009/0153028 A1 | 6/2009 | Hirosaki |
| 2009/0236969 A1 | 9/2009 | Hirosaki |

FOREIGN PATENT DOCUMENTS

| | | |
|---|---|---|
| EP | 1278250 A2 | 1/2003 |
| EP | 1873225 A1 | 1/2008 |
| EP | 1892268 A1 | 2/2008 |
| JP | S60-206889 A | 10/1985 |
| JP | 2002-363554 A | 12/2002 |
| JP | 2003-055657 A | 2/2003 |
| JP | 2004-234690 A | 8/2004 |
| JP | 2004-285363 A | 10/2004 |
| JP | 2005-112922 A | 4/2005 |
| JP | P3668770 B | 7/2005 |
| JP | 2005-255895 A | 9/2005 |
| JP | 2005255895 A | 9/2005 |
| JP | 2006-335832 A | 3/2006 |
| JP | 2006-291035 * | 10/2006 |
| JP | 2006-291035 A | 10/2006 |
| JP | 2006-335832 A | 11/2006 |
| JP | 2006-335832 A | 12/2006 |
| WO | WO 2005/019376 A1 | 3/2005 |
| WO | WO 2005/052087 A1 | 6/2005 |
| WO | WO 2006/016711 * | 2/2006 |
| WO | WO 2006/016711 A1 | 2/2006 |
| WO | 2006/080539 A1 | 8/2006 |
| WO | 2006/101096 A1 | 9/2006 |
| WO | 2006/106883 A1 | 10/2006 |
| WO | 2006/134982 A1 | 12/2006 |

OTHER PUBLICATIONS

Richardson et al., Thin-film electroluminescent devices grown on plastic substrates using an amorphous AlN:Tb3+phosphor, Applied Physics Letters, 2002, pp. 2207-2209, 80-12, American Institute of Physics, United States.

Vetter et al., Intense ultraviolet cathodoluminescence at 318 nm from Gd3+ -doped AlN, Applied Physics Letters, 2003, pp. 2145-2147, 83-11, American Institute of Physics, United States.

S.R. Jansen: "Eu-Doped Barium Aluminum Oxynitride with the β-Alumina-Type Structure as New Blue-Emitting Phosphor.", Journal of the Electrochemical Society, vol. 146, No. 2, 1999, pp. 800-806, XP002590721: USA DOI:10.1002/chin. 199921265.

G.Z. Cao: "α—Sialon ceramics: a review", Chemisry of Materials, vol. 3, Mar. 1991, pp. 242-252, XP002590722: USA DOI: 10.1021/cm00014a009.

Rong-Jun Xie, Mamoru Mitomo, Kyota Uheda, Fang-Fang Xu, Yoshio Akimune: "Preparation and Luminescence Spectra of Calcium- and Rare-Earth (R = Eu, Tb, and Pr)-Codoped alpha-SiALON Ceramics", Journal of the American Ceramic Society, vol. 85, No. 5, 2002, pp. 229-1234, XP002590723.

L.J. Gauckler, H.L. Lukas, G. Petzow: "Contribution to the Phase Diagram Si3N4-AlN-Al2-O3-SiO2", Journal of the American Ceramic Society, vol. 58, No. 7-8, Jun. 1975, pp. 346-347, XP002590724.

Rong-Jun Xie: "Fluorescence of Eu2+ in Strontium Oxonitridoaluminosilicates (SiAlONS)", Journal of the Ceramic Society of Japan, vol. 113, No. 7, Jul. 1, 2005, pp. 462-465, XP002590725.

Supplemental European search report and European search opinion dated Jul. 13, 2007 for European patent application No. EP 08 70 3122.

* cited by examiner

FLUORESCENT MATERIAL, PROCESS FOR PRODUCING THE SAME, AND LUMINESCENT DEVICE

CROSS-REFERENCE TO RELATED APPLICATIONS

The present application is a U.S. National Stage Application under 35 U.S.C. 371 of PCT/JP2008/050258, filed on Jan. 11, 2008, which claims priority to Japanese Patent Application 2007-004628, filed on Jan. 12, 2007.

BACKGROUND OF THE INVENTION

1. Field of the Invention

The present invention relates to a phosphor (fluorescent material) comprising, as a host crystal, an AlN crystal (aluminum nitride crystal), an AlN polytype crystal, or an AlN solid solution crystal; a manufacturing method thereof; and an application thereof. More specifically, the application relates to an emission apparatus of a lighting device and an image display device utilizing features of the phosphor, that is, property of emitting blue light having a peak in a wavelength range of 430 nm or longer and 480 nm and shorter. In particular, it relates to the image display device with excitation by an electron beam whose acceleration voltage is at least 10 V.

2. Background Art

The phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a white light-emitting diode (LED: Light-Emitting Diode), and so on. In any of these applications, it is necessary to provide the phosphor with energy to excite the phosphor in order to make the phosphor emit the fluorescence and the phosphor is excited by an excitation source with high energy such as a vacuum ultraviolet ray, an ultraviolet ray, an electron beam, blue light, or the like so as to emit visible light rays. However, as a result of the phosphor being exposed to such excitation source, the luminance of the phosphor tends to decrease and a phosphor having little degradation in the brightness is desired. Therefore, it has been proposed to utilize a sialon phosphor, an oxynitride phosphor, and a nitride phosphor as a phosphor having little degradation in brightness instead for the conventional phosphor such as a silicate phosphor, a phosphate phosphor, an aluminate phosphor, and a sulfide phosphor.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour (for example, refer to Patent Document 1). It was reported that α-sialon activated with an Eu ion ($Eu^{2+}$) manufactured by the above process had became a phosphor emitting yellow light in a wavelength range of 550 nm to 600 nm if excited by blue light having a wavelength range of 450 to 500 nm. A phosphor in which a rare-earth element is added to β-type sialon is also known (refer to Patent Document 2) and it is shown that phosphors activated by Tb, Yb, and Ag become phosphors emitting green light of 525 nm to 545 nm. It is also known that β-type sialon activated by $Eu^{2+}$ becomes a phosphor of green color (refer to Patent Document 3).

As an example of the oxynitride phosphor, a blue phosphor activated by Ce and having a host crystal of JEM phase ($LaAl(Si_{6-z}Al_z)N_{10-z}O_z$) (refer to Patent Document 4) and a blue phosphor activated by Ce and having a host crystal of $La_3Si_8N_{11}O_4$ (refer to Patent Document 5) are known.

As an example of the nitride phosphor, a red phosphor activated by Eu and having a host crystal of $CaAlSiN_3$ is known (refer to Patent Document 6). Moreover, it was reported in Nonpatent Document 1 that an orange or red phosphor having an emission peak from the Eu ion ($Eu^{3+}$) in the range of 580 nm to 640 nm had been obtained, as a phosphor having AlN as a host, by synthesizing an amorphous ceramic thin film of phosphor activated by a trivalent Eu ion ($Eu^{3+}$) (i.e., AlN: $Eu^{3+}$) at the room temperature with a magnetron sputtering method. In Nonpatent Document 2, it was reported that a phosphor of amorphous AlN thin film activated by $Tb^{3+}$ had emitted green light having a peak at 543 nm upon excitation by an electron beam. In Nonpatent Document 3, a phosphor of AlN thin film activated by $Gd^{3+}$ was reported. However, these kinds of phosphors based on AlN are amorphous thin films which are not suitable for any application in a light or an image display device.

As a blue phosphor for applications to an image display device (VFD, FED, SED, or CRT) using an electron beam as the excitation source, a phosphor having $Y_2SiO_5$ as a host crystal and including solid-solute Ce (Patent Document 7) and a phosphor of ZnS including a solid-solute emission ion such as Ag (Patent Document 8) were reported.

The present inventor proposed a phosphor having an AlN structure crystal as a host crystal and including a divalent Eu ion ($Eu^{2+}$) (i.e., AlN: $Eu^{2+}$) in Patent Document 9 (not yet published). The phosphor can be obtained by firing a composite of AlN to which $Si_3N_4$ and $Eu_2O_3$ are added at the same or higher temperature than 1800° C. and exhibits blue fluorescence derived from $Eu^{2+}$ as divalent Eu ions ($Eu^{2+}$) are stabilized by incorporating Si, Eu, and oxygen into the AlN crystal structure as solid solutes.

Furthermore, the present inventor proposed in Patent Document 10 that a phosphor having an AlN structure crystal as a host crystal and including a divalent Eu ion was so superior in the luminance life, especially when excited with an electron beam, that an electron beam excited light-emitting device, such as the field emission display, using such a phosphor might have a long operating life.

[Patent Document 1] Specification of Japanese Patent No. 3,668,770
[Patent Document 2] Japanese Patent Application Publication No. S60-206889
[Patent Document 3] Japanese Patent Application Publication No. 2005-255895
[Patent Document 4] WO 2005/019376 pamphlet
[Patent Document 5] Japanese Patent Application Publication No. 2005-112922
[Patent Document 6] WO 2005/052087 pamphlet
[Patent Document 7] Japanese Patent Application Publication No. 2003-55657
[Patent Document 8] Japanese Patent Application Publication No. 2004-285363
[Patent Document 9] Specification of Japanese Patent Application No. 2004-234690
[Patent Document 10] Japanese Patent Application Publication No. 2006-291035
[Non patent Document 1] Meghan L. Caldwell, et al., "Visible Luminescent Activation of Amorphous AlN: Eu Thin-Film Phosphors with Oxygen", MRS Internet Journal Nitride Semiconductor Research, Vol. 6, Num. 13, P1-8, 2001.

[Non patent Document 2] H. H. Richardson, et al., "Thin-film electroluminescent devices grown on plastic substrates using an amorphous AlN: $Tb^{3+}$ phosphor," Applied Physics Letters, Vol. 80, No. 12, p. 2207-2209, 2002.

[Non patent Document 3] U. Vetter, et al., "Intense ultraviolet cathodoluminescence at 318 nm from $Gd^{3+}$-doped AlN," Applied Physics Letters, Vol. 83, No. 11, P2145-2147, 2003.

BRIEF SUMMARY OF THE INVENTION

Disclosure of the Invention

Problem to be Solved by the Invention

In applications for a white LED and an image display device using an ultraviolet LED as an excitation source, there remains a demand for a blue phosphor having excellent durability and high luminance. In addition, in applications for image display devices excited with an electron beam, such as FED, there remains a demand for a phosphor that excels in durability, emits light with high luminance when irradiated with an electron beam, and has high color purity.

An oxide phosphor disclosed in Patent Document 7 which is used with electron beam excitation might deteriorate while being used so that the emission intensity might be lowered, thereby changing the color balance in the image display device. A sulfide phosphor disclosed in Patent Document 8 might be decomposed while being used so that sulfur might be scattered to contaminate the device.

A phosphor having an AlN-based crystal as a host crystal and being activated by a divalent Eu ion is a phosphor to emit blue light, which is excellent in an electron beam excitation characteristic and durability as shown in Patent Document 10. However, a peak wavelength thereof is 470 nm or longer such that the phosphor does not have a sufficient color purity as a blue phosphor.

It is an object of the present invention to try to satisfy such demand and to provide a blue phosphor having better emission properties than a conventional sialon phosphor activated by a rare earth element and higher durability than a conventional oxide phosphor, thereby providing a blue phosphor to emit light of high intensity and of high color-purity upon irradiation of an electron beam.

Means to Solve the Problem

The present inventor has found, as a result of intensive investigations on nitrides or oxynitrides including at least Eu solid-solved in the AlN crystal, the AlN polytype crystal, or the AlN solid solution crystal under such circumstances, that some of those having specific compositions, specific solid solution states, and specific crystalline phases can be a blue phosphor having an emission peak in the wavelength range of 430 nm or longer to 480 nm or shorter derived from the divalent Eu ion. Further, it has been found that those having specific compositions, which include incorporated (solid-solved) silicon, have high luminance when excited with an ultraviolet ray or an electron beam, and are suitable especially for the application to an image display device exited with the electron beam. It has further been found that, if needed, those having specific compositions, which include solid-solved carbon, have high luminance when excited with the ultraviolet ray or the electron beam, and are suitable especially for the application to an image display device exited with the electron beam. It has been found that, if needed, those further containing a metal element A (where A is one or two or more kinds of elements selected from Mg, Ca, Sr, Ba, Zn, and Cd) have high emission luminance. In addition, it has been found that a blue phosphor having excellent color purity can be obtained by adjusting the amount of oxygen concentration in the crystals to 0.4 mass % or less.

According to Non Patent documents 1, 2, and 3, it was reported that thin films of AlN amorphous thin films activated by $Eu^{3+}$, $Tb^{3+}$, and $Gd^{3+}$ had emitted light upon the electron beam excitation. However, inorganic compounds having, as a host crystal, the AlN crystal, the AlN polytype crystal, or the AlN solid solution crystal including the metal element A and silicon have never been tried to be investigated in order to utilize them as the phosphor. Although Patent document 10 discloses that an AlN-based phosphor in which a specific metal element and silicon are incorporated as solid solutes can become a phosphor suitable for the electron beam excitation, the present inventor has found for the first time that the emission wavelength of the phosphor is shifted to become shorter by lowering the oxygen content such that the phosphor can have higher color purity.

As a result of further intensive investigations on the basis of this discovery, a phosphor that shows a luminous phenomenon with high intensity in a specific wavelength range and a manufacturing method of the phosphor, and a lighting device and an image display device having superior properties have been successfully provided. These are more specifically described in the following (1) to (19).

(1) The phosphor comprising: an inorganic crystal having a crystal structure of an AlN crystal, an AlN polytype crystal, or an AlN solid solution crystal, wherein at least divalent europium is solid-solved in the inorganic crystal and an amount of oxygen in the inorganic crystal is not exceeding 0.4 mass %.

(2) The phosphor according to the above (1) wherein the inorganic crystal has a wurtzite-type AlN crystal structure, a crystal structure selected from $2H^\delta$; 27R; 21R; 12H; 15R; and 8H, or a crystal structure having an $Al(O, N)_4$ tetrahedron skeleton therein.

(3) The phosphor according to the above (1), wherein the AlN polytype crystal comprises: a layer constituted of an $Al(O, N)_4$ tetrahedron skeleton and a layer constituted of a skeleton including Eu.

(4) The phosphor according to the above (1), wherein silicon is solid-solved in the inorganic crystal.

(5) The phosphor according to the above (4), wherein carbon is solid-solved in the inorganic crystal.

(6) The phosphor according to the above (1), wherein the inorganic crystal is a solid solution crystal of the AlN crystal or the AlN polytype crystal, and a SiC crystal.

(7) The phosphor according to the above (1), wherein a metal element A (where A is one or two or more elements selected from Mg, Ca, Sr, Ba, Zn, and Cd) is solid-solved in the inorganic crystal.

(8) The phosphor according to the above (1), wherein the inorganic crystal is expressed by a compositional formula $Eu_aA_bAl_cSi_dO_eN_fC_g$ (where A is one or two or more kinds of elements selected from Mg, Ca, Sr, Ba, Zn, and Cd; and $a+b+c+d+e+f+g=1$) and wherein:

$$0.00001 \leq a \leq 0.1 \quad (i);$$

$$0 \leq b \leq 0.2 \quad (ii);$$

$$0.4 \leq c \leq 0.55 \quad (iii);$$

$$0.005 \leq d \leq 0.2 \quad (iv);$$

$$0.001 \leq e \leq 0.05 \quad (v);$$

$0.3 \leq f \leq 0.55$ (vi); and $0 \leq g \leq 0.02$ (vii).

(9) The phosphor according to the above (1), wherein the excitation source is visible light or ultraviolet ray having a wavelength that is at least 100 nm and not exceeding 420 nm, or an electron beam.

(10) A method of manufacturing the phosphor recited in any one of the above (1) to (9), comprising the step of: firing a raw material mixture comprising europium, aluminum, silicon if necessary, and an element A if necessary (where, A is one or two or more kinds of elements selected from Mg, Ca, Sr, Ba, Zn, and Cd) in a nitrogen atmosphere in a temperature range of $15 \times 10^{2\circ}$ C. or higher and $25 \times 10^{2\circ}$ C. or lower until an oxygen content becomes not exceeding 0.4 mass %.

Also, a method of manufacturing a phosphor including an inorganic crystal having any crystal structure among a wurtzite-type AlN crystal structure, a crystal structure selected from a group consisting of $2H^6$, 27R, 21R, 12H, 15R, and 8H, or a crystal structure having an $Al(O,N)_4$ tetrahedron skeleton in the inorganic crystal can be provided. The method of manufacturing the phosphor comprises the steps of: mixing a mixture comprising compounds of silicon nitride powder, aluminum nitride, europium oxide, and an element A if necessary (where A is one or two or more kinds of elements selected from Mg, Ca, Sr, Ba, Zn, and Cd) wherein the mixture contains an oxygen content more than 0.4 mass % as a whole; and firing the mixture in a nitrogen atmosphere of 0.1 MPa or higher to 100 MPa or lower in a temperature range of $15 \times 10^{2\circ}$ C. or higher to $25 \times 10^{2\circ}$ C. or lower. The firing is carried out such that the fired inorganic compound contains the oxygen content not exceeding 0.4 mass %. Here, it is considered that the element A is effective in helping silicon solid-solved in the crystals. For example, when the element A is zinc, it is considered that the zinc might be vaporized after having helped silicon solid solved in the crystals during the firing step such that it could be difficult to detect the zinc in the fired inorganic compound. Furthermore, it is also considered that introduction of the divalent ion, even though its amount may be a very small quantity, is effective in improving electric conductivity to enhance emission efficiency upon electron beam excitation, thereby increasing luminance.

(11) The method of manufacturing the phosphor according to the above (10), comprising the step of: filling a raw material mixture comprising europium metal, europium oxide, europium carbonate, europium nitride, europium fluoride, europium chloride, europium oxynitride, or a combination thereof; aluminum nitride; silicon nitride if necessary; and element A metal, element A oxide, element A carbonate, element A nitride, element A fluoride, element A chloride, element A oxynitride, or a combination thereof (where A is one or two or more kinds of elements selected from Mg, Ca, Sr, Ba, Zn, and Cd) if necessary in a container with a bulk density thereof not exceeding 40%, and then firing the thus-filled mixture in the nitrogen atmosphere that is at least 0.1 MPa and not exceeding 100 MPa in the temperature range that is at least $15 \times 10^{2\circ}$ C. and not exceeding $25 \times 10^{2\circ}$ C.

(12) The method of manufacturing the phosphor according to the above (10), wherein a compound containing silicon carbide or carbon is further added to the raw material mixture.

(13) A lighting device utilizing the phosphor as recited in any one of the above (1) to (9), comprising: an emission source emitting light having a wavelength of 330 nm to 420 nm as an excitation source of the phosphor.

(14) The lighting device according to the above (13), wherein the emission source is an LED or an LD, the lighting device comprising, in addition to the aforementioned phosphor, a green phosphor having an emission peak at a wavelength of 520 nm to 550 nm by excitation light of 330 to 420 nm; and a red phosphor having an emission peak at a wavelength of 600 nm to 700 nm by excitation light of 330 to 420 nm.

(15) The lighting device according to the above (13) or (14), wherein the emission source is an LED or an LD, the lighting device comprising, in addition to the aforementioned phosphor, a yellow phosphor having an emission peak at a wavelength of 550 nm to 600 nm by excitation light of 330 to 420 nm.

(16) The lighting device according to the above (14), wherein the green phosphor is a β-sialon phosphor activated by Eu, and the red phosphor is a $CaAlSiN_3$ phosphor activated by Eu.

(17) The lighting device according to the above (15), wherein the yellow phosphor is a α-sialon phosphor activated by Eu.

(18) An image display device utilizing the phosphor as recited in any one of the above (1) to (9) as a display element, wherein the image display device has an excitation source to cause the phosphor to emit light.

(19) The image display device according to the above (18), being any one of a fluorescent display tube (VFD), a field emission display (FED or SED), and a cathode-ray tube (CRT), wherein the excitation source is an electron beam whose acceleration voltage is from 10 V or higher to 30 kV or lower.

Effect of the Invention

The phosphor according to the present invention includes as a main component an AlN crystal, an AlN polytype crystal, or an AlN solid solution crystal phases, in which divalent Eu ions are incorporated as solid solutes, and has a composition having an oxygen content not exceeding 0.4 mass %. Whereby, the phosphor has high emission intensity in the range of 430 nm to 480 nm as compared to conventional sialon and oxynitride phosphors, and emits light efficiently, in particular, when it is excited by an ultraviolet ray or visible light having a wavelength of 100 nm or longer to 420 nm or shorter. Therefore, the phosphor is excellent as a blue phosphor utilized for the application to a white LED.

Further, it is a useful phosphor that can be utilized suitably in a VFD, an FED, an SED, and a CRT since it emits light efficiently upon excitation with the electron beam.

EXPLANATION OF NUMERALS

Figure 1:
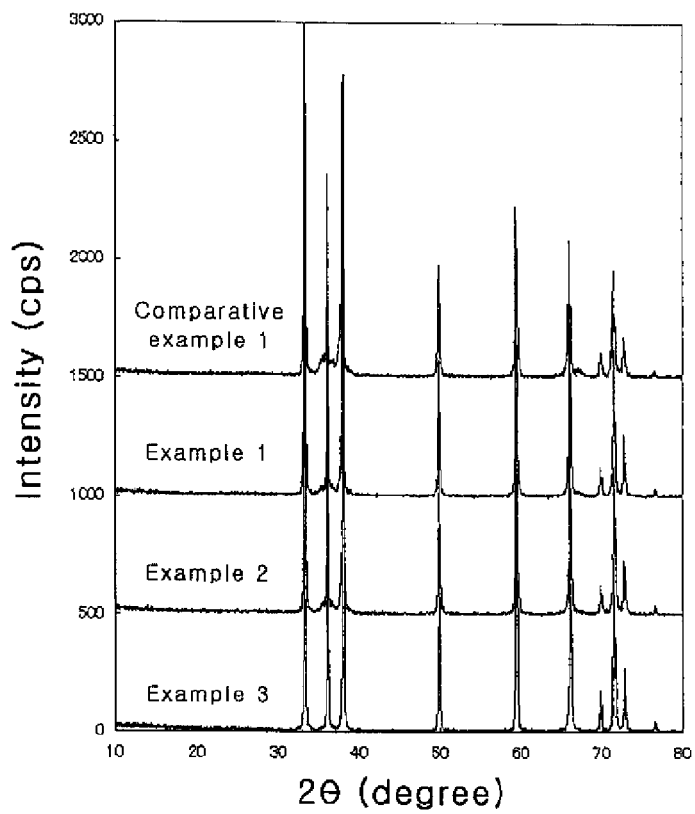
FIG. 1 shows an X-ray diffraction patterns of Examples 1 to 3 and Comparative example 1.

1—mixture of a yellow phosphor and a blue phosphor of the present invention (Example 1), or mixture of a green phosphor, a red phosphor, and a blue phosphor of the present invention (Example 1); 2—LED chip; 3, 4—electrically conductive terminal; 5—wire bond; 6—resin layer; 7—container; 8—red phosphor; 9—green phosphor; 10—blue phosphor; 11, 12, 13—ultraviolet emission cell; 14, 15, 16, 17—electrode; 18, 19—dielectric layer; 20—protection layer; 21, 22—glass substrate; 51—glass; 52—cathode; 53—anode; 54—gate; 55—emitter; 56—phosphor; 57—electron.

DETAILED DESCRIPTION OF THE INVENTION

Best Mode for Carrying Out the Invention

In the following, embodiments of the present invention are described in detail.

The phosphor of the present invention may include an inorganic crystal having a crystal structure of an AlN crystal, AlN polytype crystal, or an AlN solid solution crystal as a main component. The AlN crystal is a crystal having a wurtzite-type crystal structure. The AlN solid solution crystal is a crystal in which silicon and oxygen are added to AlN. Further, it may also include a crystal having an Al(O, N)$_4$ tetrahedron skeleton in a crystal structure thereof. As examples of the AlN solid solution crystal or the crystal having the Al(O, N)$_4$ tetrahedron skeleton in the crystal structure, the following are listed:

2Hδ: $Si_{2.40}Al_{8.60}O_{0.60}N_{11.40}$,
27R: $Al_9O_3N_7$: $1Al_2O_3$-7AlN,
21R: $Al_7O_3N_5$: $1Al_2O_3$-5AlN,
12H: $SiAl_5O_2N_5$: $1SiO_2$-5AlN,
15R: $SiAl_4O_2N_4$: $1SiO_2$-4AlN,
8H: $Si_{0.5}Al_{3.5}O_{2.5}N_{2.5}$: $0.5SiO_2$-$0.5Al_2O_3$-2.5AlN;

and so on. These crystals have the Al(O, N)$_4$ tetrahedron skeleton in their crystal structures. In the AlN solid solution crystal, solid-solved oxygen atoms may partially replace nitrogen atoms of the AlN crystal, and silicon atoms may partially replace Al atoms of the AlN crystal.

In the AlN solid solution crystal, a composition having SiC incorporated in the AlN as a solid solute may be obtained. In this case, silicon atoms may partially replace aluminum atoms of the AlN crystal. Carbon atoms may also partially replace aluminum atoms of the AlN crystal. Further, in the AlN solid solution crystal, Al(O, N)$_4$ tetrahedrons in which oxygen atoms and silicon atoms are incorporated as solid solutes are connected one after another so as to form layers and such layers are stacked with a specific long repetition interval such that layered crystal structures may be formed. The above crystals 15R, 12H, 21R, 27R, and the like have the layered crystal structures. Here, the digits in the expression formulae indicate the number for one cycle. These are referred to as polytype crystal. The metal element A described later may replace Al atoms in the crystal structure, or may be contained in the layer of Al(O, N)$_4$ tetrahedron which is rich in oxygen. These crystals having a variety of forms are also included in the AlN polytype crystal or the AlN solid solution crystal. As used herein, if the concentration of the inorganic crystal having a crystal structure of the AlN crystal, the AlN polytype crystal, or the AlN solid solution crystal is 10 mass % or more in the phosphor, such inorganic crystal may be the main component.

An AlN polytype crystal can have a structure comprising a layer constituted of an Al(O, N)$_4$ tetrahedron skeleton and a layer constituted of a skeleton including Eu. About 3 to 20 layers comprising the Al(O, N)$_4$ tetrahedron skeleton are stacked in a C-axis direction of the wurtzite-type AlN crystal, and then about 1 to 3 layers comprising the skeleton including Eu are stacked thereon. Over the layers thus stacked, the layers comprising the Al(O, N)$_4$ tetrahedron skeleton (hereinafter, also simply referred to as Al(O, N)$_4$ tetrahedron layer) are stacked again. In this manner, sets of layers comprising different skeletons are alternately stacked so as to form the AlN polytype crystal. The alternate lamination of the sets of the layers comprising different skeletons may be repeated with the same interval throughout the entire crystal or with different intervals in different parts of the entire crystal. The layer comprising the Al(O, N)$_4$ tetrahedron skeleton has a function to stabilize the crystal structure, and the layer comprising a skeleton including Eu has a function to emit light. It is difficult to detect these laminate structures by the X-ray diffraction measurement, and peak positions of the AlN polytype crystal by the X-ray diffraction measurement do not differ much from those of the wurtzite-type AlN crystal even though the AlN polytype crystal has different laminate structures. The difference in the laminate structures can be determined by the transmission electron microscope. When observing the AlN polytype crystal by the transmission electron microscope, the layer comprising the Al(O, N)$_4$ tetrahedron skeleton can be distinguished from the layer comprising the skeleton including Eu, and numbers of stacked layers of respective kinds and the state of repeated sets of layers can be observed. Since such laminate structures are taken, Eu ions which are emission ions are located in the crystal with appropriate distances apart from each other. As a result, the decrease of the emission intensity (concentration quenching) caused by the interaction among Eu ions may be effectively prevented.

In the present invention, the above crystals may be used as host crystals. The AlN crystal, the AlN polytype crystal, or the AlN solid solution crystal can be identified by the X-ray diffraction or the neutron beam diffraction. Not only substances which exhibit the same diffraction pattern as the pure AlN crystal, the AlN polytype crystal, or the AlN solid solution crystal, but also substances having lattice parameters altered by replacing constituent elements with other elements are also included as part of the present invention.

An inorganic crystal in the phosphor of the present invention can become a phosphor having excellent optical characteristics by incorporating Eu, a metal element A if necessary (where A is one or two or more kinds of elements selected from Mg, Ca, Sr, Ba, Zn, and Cd), and silicon (Si) as solid solutes into the AlN crystal, the AlN polytype crystal, or the AlN solid solution crystal as the host crystal; and by making the oxygen content included in the crystal equal to or less than 0.4 mass %. Here, Eu is an element serving as an optically active ion, and incorporated as a divalent ion. And $Eu^{2+}$-derived light emission occurs upon excitation by an ultraviolet ray or an electron beam such that a phosphor which emits blue light having a peak in a wavelength range of 430 nm to 480 nm may be obtained.

The effect of the addition of silicon is thought as follows. Since Si is a tetravalent element, $Eu^{2+}$ being a divalent ion can be stabilized in the crystal by incorporating Si as a solid solute, and the Eu ion becomes more easily introduced into the crystal. Since it may be easier to form the laminate structures in which silicon is incorporated into the AlN crystal by the addition of silicon, the Eu ion becomes more easily introduced into the laminate structures. Therefore, it is considered that these effects contribute to the improvement of phosphor brightness.

The phosphor having excellent optical characteristics can be obtained by further incorporating carbon (C), as a solid solute, into the inorganic crystal in the phosphor of the present invention. The effect of addition of carbon can be considered as follows. Since the AlN crystal and the SiC crystal can have a wurtzite-type crystal structure, these crystals easily form solid solution. It is considered that the crystal structure of the solid solution is stabilized by adding carbon or silicon carbide, which contributes to the increase of brightness. Further, since solid solution changes the energy level of the emission ion, the addition is also effective to change the excitation spectrum and the emission spectrum.

The metal element A is added as appropriate. The effect of the addition of the metal element A is thought as follows. The element A is an element which may serve as a divalent ion. The element A may be one or two or more kinds of elements selected from the group consisting of Mg, Ca, Sr, Ba, Zn, and Cd. It is considered that this metal element A is effective to help Si incorporated into the crystal as a solid solute. Further, it is also considered that the electric conductivity of the phosphor is improved by incorporating divalent ions therein such that the emission efficiency by the electron beam excitation is effectively improved. In particular, a phosphor to which Zn or Ba is added exhibits high intensity of the emission upon the electron beam excitation.

As an embodiment of the present invention, a phosphor in which the element A is Zn and a phosphor in which the element A is Ba may be referred to. The phosphor in which the element A is Zn exhibits, in particular, high intensity of the emission upon the electron beam excitation, and is suitable for the application to an image display device utilizing the electron beam excitation. The phosphor in which the element A is Ba exhibits high intensity of the emission upon the electron beam excitation, and a peak wavelength of the fluorescence spectrum thereof shifts toward short wavelength side to be a wavelength of 470 nm or shorter by the addition of Ba, thereby improving the blue color purity. Therefore, the above phosphors are suitable for the application to the blue phosphor used for the image display device utilizing the electron beam excitation.

The amount of oxygen contained in the crystal affects the emission spectrum such that the emission peak wavelength of the composition containing less amount of oxygen becomes a shorter wavelength, and since blue color emission light having the excellent color purity is emitted by the phosphor of the composition containing oxygen content of 0.4 mass % or less, the phosphor is suitable for the application to the blue phosphor used in the image display device.

As the composition of the phosphor having high brightness and a high content ratio of the AlN crystal, the AlN polytype crystal or the AlN solid solution crystal, the composition is expressed by the compositional formula $Eu_a A_b Al_c Si_d O_e N_f C_g$ (where A is one, two, or more kinds of elements selected from Mg, Ca, Sr, Ba, Zn, and Cd, and a+b+c+d+e+f+g=1), and it is preferable for the parameters to satisfy all of the following conditions:

$0.00001 \leq a \leq 0.1$ (i), $0 \leq b \leq 0.20$ (ii), $0.4 \leq c \leq 0.55$ (iii), $0.005 \leq d \leq 0.2$ (iv), $0.001 \leq e \leq 0.05$ (v), $0.3 \leq f \leq 0.55$ (vi), and $0 \leq g \leq 0.02$ (vii).

Here, the parameter a value represents the amount of Eu which is to be the center of emission and may be adjusted equal to 0.00001 or more and equal to 1 or less in terms of the atomic ratio. If the parameter a value is less than 0.00001, the emission luminance may be lowered because the number of Eu to be the center of emission is too low. If the parameter a value is more than 0.1, the emission luminance may be lowered because of the concentration quenching caused by the interference among the Eu ions. The parameter b value represents the amount of the element A, which is added as appropriate. The addition amount may be adjusted equal to 0.2 or less in terms of the atomic ratio. If the parameter b value becomes out of this range, the emission intensity may be lowered since a generation ratio of crystal phases other than the AlN crystal, the AlN polytype crystal, and the AlN solid solution crystal is increased because the bonds in the crystals become unstable. The parameter c value represents the amount of the element Al and may be adjusted equal to 0.4 or more and equal to 0.55 or less. If the parameter c value becomes out of this range, the emission intensity may be lowered since a generation ratio of crystal phases other than the AlN crystal, the AlN polytype crystal, or the AlN solid solution crystal is increased. The parameter d value represents the amount of Si and may be adjusted equal to 0.005 or more and equal to 0.2 or less. If the parameter d value becomes out of this range, the brightness may be lowered since the solid solution of Eu is prevented. The parameter e value represents the amount of oxygen and may be adjusted equal to 0.001 or more and equal to 0.05 or less. If the parameter e value becomes less than 0.001, the brightness may be lowered since the solid solution of Eu is prevented. If the parameter e value becomes more than 0.1, the emission intensity may be lowered since a generation ratio of crystal phases other than the AlN solid solution crystal is increased. The parameter f value represents the amount of nitrogen and may be adjusted equal to 0.3 or more and equal to 0.55 or less. If the parameter f value becomes out of this range, the emission intensity may be lowered since a generation ratio of crystal phases other than the AlN crystal, the AlN polytype crystal, or the AlN solid solution crystal is increased. The parameter g value represents the amount of carbon and may be adjusted equal to 0.02 or less if the carbon is added although the addition of carbon is optional. If the parameter g value becomes out of this range, the emission intensity may be lowered since free carbon is precipitated.

If the phosphor of the present invention is used in a powder state, it is preferable that the average particle diameter is from 0.1 μm to 20 μm in consideration of dispersibility into a resin and fluidity of the substance in a powder state. The emission luminance may be improved by generating single crystalline particles in this range from the powder substance.

Since the phosphor of the present invention emits light efficiently by the excitation with the ultraviolet ray or visible light having a wavelength of 100 nm or longer and 420 nm or shorter, the phosphor is suitable for application to the white LED. Moreover, the phosphor of the present invention may also be excited by the electron beam or the X-ray. Since the phosphor of the present invention, in particular, emits light more efficiently by the electron beam excitation than other nitride phosphors, the phosphor is suitable for application to the image display device in which the electron beam is used as the excitation source. Further, the brightness is hardly deteriorated by the exposure to the excitation source.

A fluorescence having a peak in the wavelength range from 430 nm to 480 nm is emitted by the phosphor of the present invention upon irradiation of the excitation source. The color of the emission spectrum has (x, y) values on the CIE chromaticity coordinates of $0 \leq x \leq 0.15$ and $0.05 \leq y \leq 0.1$, which correspond to the blue color of high calorimetric purity.

It is preferable that the phosphor of the present invention contain as much inorganic crystal of high purity as possible from the viewpoint of fluorescence emission, the inorganic crystal containing the AlN crystal, the AlN polytype crystal, or the AlN solid solution crystal to be a constituent of the phosphor, and it is even preferable, if possible, that the phosphor is constituted of the single phase of the inorganic crystal, but the phosphor may contain other crystal phases or an amorphous phase as long as the properties are not deteriorated. In order to obtain high brightness in this case, it is preferable to contain 10 mass % or more of inorganic crystal including the AlN crystal, the AlN polytype crystal, or the AlN solid solution crystal and more preferable to contain 50 mass % or more. The main component of the phosphor according to the present invention has the content range of at least 10 mass % or more of inorganic crystal including the AlN crystal, the AlN polytype crystal, or the AlN solid solution crystal. The content ratio of each component can be determined by performing X-ray diffraction measurements and calculating ratios of respective highest peaks of respective crystal phases of the inorganic crystal including the AlN crystal, the AlN polytype crystal, or the AlN solid solution crystal, and the other crystals.

For example, the other crystal phases and the amorphous phases can be inorganic substance having electric conductivity. In the VFD or FED, if the phosphor of the present invention is excited by the electron beam, it is preferable that the phosphor has the electric conductivity to some extent since electrons are not accumulated on the phosphor, but are released outside. As the conductive substance, oxide, oxynitride, nitride, or a mixture thereof containing one or two or more kinds of elements selected from among Zn, Ga, In, and Sn may be referred to. In particular, indium oxide and indium tin oxide (ITO) are desirable since the fluorescence intensity is hardly lowered and the electric conductivity is high.

While the phosphor of the present invention emits blue light, if it is necessary to mix the blue light with other color light such as yellow light and red light, another inorganic phosphor which emits light of the other color light can be mixed in.

In phosphors according to the present invention, the excitation spectra and the fluorescence spectra vary depending on compositions thereof so that it is possible to combine appropriately and selectively these different phosphors in order to design combined phosphors emitting a variety of emission spectra. In an embodiment, the combined phosphor may be designed to obtain a necessary spectrum according to the application.

The method for producing the phosphor of the present invention is not particularly limited, but the following method can be set forth as an example.

The example is a manufacturing method comprising the step of: firing a raw material mixture comprising europium, aluminum, silicon as appropriate, and an element A if necessary (where A is one or two or more kinds of elements selected from the group consisting of Mg, Ca, Sr, Ba, Zn, and Cd) in a nitrogen atmosphere in a temperature range from 1500° C. or higher and 2500° C. or lower until an oxygen content becomes 0.4 mass % or less.

A predetermined amount of a raw material is mixed, and then the raw material mixture is filled in a container in a state where a relative bulk density of 40% or less is maintained. The mixture is then fired in a nitrogen atmosphere of 0.1 MPa or higher and 100 MPa or lower in a temperature range of 1500° C. or higher and 2500° C. or lower. Accordingly, the phosphor of the present invention, in which at least Eu, and, a metal element A and silicon if necessary, are solid-solved in an AlN crystal, an AlN polytype crystal, or an AlN solid solution crystal, can be manufactured. The optimum firing temperature may vary according to the compositions, so that it can be optimized for each composition. In general, the firing is preferably performed in a temperature range of 1950° C. or higher and 2100° C. or lower. Thus, the phosphor with high luminance can be obtained. If the firing temperature is lower than 1500° C., Eu to serve as the emission center is difficult to be solid-solved in the AlN crystal, the AlN polytype crystal, or the AlN solid solution crystal, and it is considered that the Eu remains in a grain boundary phase. In this case, light is emitted from the emission center hosted by oxide glass, and it is hard to obtain a phosphor to emit the light at the wavelength to be targeted with high luminance. If the firing temperature is over 2500° C., a special device is required, which is industrially undesirable.

In the firing step, heating is continued until the oxygen content becomes 0.4 mass % or less in case where the content is more than 0.4 mass %. If the raw material mixture or the AlN-based phosphor is heated to a temperature of 1950° C. or higher, oxygen contained in the treated material volatizes out of the treated material, resulting in reduction of the oxygen content. Since the firing is performed at the high temperate in the nitrogen atmosphere, the reduction of the oxygen content can be accelerated as the firing temperature becomes higher and the firing time becomes longer. The firing temperature and/or time is appropriately adjusted so that the final oxygen content in the phosphor becomes 0.4 mass % or less. Since the oxygen content can be reduced to 0.4 mass % or less by the firing, it is not necessary that the oxygen content of starting materials is 0.4 mass % or less, but it may be more than 0.4 mass %. When the amount of oxygen decreases, the environment surrounding Eu ions serving as the emission center changes and the emission wavelength becomes a lower wavelength, which improves blue color purity. A blue phosphor with excellent color purity may be obtained such that the emission color of the phosphor is in the range of the CIE color coordinates (x, y) of $0 \leq x \leq 0.15$, and $0.05 \leq y \leq 0.1$ as a typical chromaticity of the phosphor of the present invention. This effect will diminish if the oxygen content is more than 0.4 mass %.

As a starting material of the metal element Eu, europium metal, europium oxide, europium carbonate, europium nitride, europium fluoride, europium chloride, or europium oxynitride can be used. It is preferable to use particularly europium oxide among them since it is stable in the air and readily available.

As a starting material of the metal element A, element A metal, element A oxide, element A carbonate, element A nitride, fluoride, element A chloride, element A oxynitride, or a combination thereof (where A is one or two or more kinds of elements selected from Mg, Ca, Sr, Ba, Zn, and Cd) can be used. If A is Zn, zinc oxide is preferably used. If A is Ba, barium carbonate is preferably used.

Although silicon metal, silicon oxide, silicon nitride, silicon carbide, organic precursor substance containing silicon, silicon diimide, amorphous substance obtained by heat-treating silicon diimide, or the like can be used as a starting material of the silicon source, the silicon nitride or silicon carbide may generally be utilized. These materials have high reactivity and can be obtained as a synthesized compound of high purity, and further have the advantage that they are readily available because these materials are produced as industrial raw materials. As the silicon nitride, α-type, β-type, amorphous variation, and a mixture thereof can be used. As the silicon carbide, α-type, β-type, amorphous variation, and a mixture thereof can be used.

As a starting material of an aluminum source, aluminum metal, aluminum oxide, aluminum nitride, organic precursor substance containing aluminum, and the like can be used. However, it is generally preferable to use the aluminum nitride. These materials have high reactivity and can be obtained as a synthesized compound of high purity, and further have the advantage that they are readily available because the materials are produced as industrial raw materials.

Here, the raw material mixture may further include a carbon source containing carbon. As described above, the luminance of the phosphor to be obtained can be improved by adding carbon. As a starting material including a carbon source, silicon carbide and a compound containing carbon can be used, and usually, silicon carbide is favorably used. As the compound containing carbon, carbon, an organic substance containing carbon and silicon, or the like can be used. These materials are produced as industrial raw materials and have advantage in the availability.

In order to enhance reactivity in firing, an inorganic compound which forms a liquid phase at the firing temperature or below can be added to a mixture of starting materials if necessary. As the inorganic compound, what produces a stable liquid phase at the reaction temperature is preferred, and fluoride, chloride, iodide, bromide, or phosphate of element Li, Na, K, Mg, Ca, Sr, Ba, or Al is suitable. The above inorganic compound may be added singly or be added together in a combination of two or more kinds thereof. In particular, barium fluoride and aluminum fluoride have high capability to enhance the reactivity in the synthesis and hence are preferable. Although the amount of addition of the inorganic compound is not particularly limited to, but the amount of 0.1 weight part or more and 10 weight part or less is effectively added to 100 weight part of the mixture of the metal compounds constituting the starting materials so as to render a large effect. The reactivity is not so improved if the amount of addition is smaller than 0.1 weight part, and the brightness of the phosphor may be lowered if the amount is larger than 10 weight part. If the mixture to which these inorganic compounds are added is fired, the reactivity is improved so that the particle growth is promoted in a relatively short period of time so as to yield single crystals with large particle diameters, and the brightness of the phosphor is improved.

As the nitrogen atmosphere, a gaseous atmosphere in a pressure range that is at least 0.1 MPa and that does not exceed 100 MPa is preferable. It is more preferable that the pressure range that is at least 0.5 MPa and that does not exceed 10 MPa. When silicon nitride is used as a raw material and the firing process is performed at a temperature of 1820° C. or higher, the silicon nitride contained in the raw material decomposes easily in a nitrogen atmosphere of 0.1 MPa or lower, which is undesirable. When the nitrogen atmosphere has a pressure higher than 0.5 MPa, almost no decomposition occurs. The pressure of 10 MPa is good enough. And special equipment is required for a pressure of 100 MPa or higher, so that such pressure condition is inappropriate for the industrial production.

When fine powder of a particle diameter of several micrometers is employed as a starting material, the mixture of metal compounds after completion of the mixing process exhibits morphology in which the fine powder of a particle diameter of several micrometers aggregates to a size of several hundreds of micrometers to several millimeters (hereinafter called "powder aggregate"). In the present invention, the powder aggregate is fired in a state with the packing fraction maintained in a bulk density that does not exceed 40%. Here, the term relative bulk density means the ratio of a value (bulk density) given by dividing the mass of powder material packed in the container by the capacity of the container to the real density of the substance of the powder material. In a typical sialon production, a hot pressing method in which heating is conducted as it is pressurized or a manufacturing method of firing after die molding (powder compacting) is employed, and hence the firing process is conducted in a state where the powder packing fraction is high. In the present invention, however, the powder aggregate of a mixture in which the particle size is made uniform is charged into a vessel or the like with a packing fraction of a bulk density that does not exceed 40% without applying any mechanical force or without molding with a die in advance. If necessary, the powder aggregate may be subject to particle size control by granulating to an average particle diameter that does not exceed 500 μm by using a sieve or an air classifier. Otherwise, the powder aggregate may be granulated directly into a shape of 500 μm or smaller by using a spray dryer. A vessel of boron nitride has an advantage of little reactivity with the phosphor.

The reason why the firing process is performed while the bulk density is maintained not to exceed 40% is to fire the raw material powder while a free space is maintained around the raw material powder. The optimal bulk density depends on the shapes and surface conditions of the granulated particles, but it is typically preferable for it not to exceed 20%. In this way, crystals of reaction products grow in a free space, so that it is likely that the crystals have smaller chance to come into contact with each other, whereby crystals with a smaller number of surface defects are synthesized. Therefore, a high-brightness phosphor may be obtained. And powder products with fine particles are unlikely to be obtained. The size of the powder aggregate of 500 μm or smaller is particularly preferable to achieve excellent grinding properties after the firing. When the bulk density exceeds 40%, partial densification takes place during the firing so that a dense sintered body appears, which hinders crystal growth. As a result, the brightness of the phosphor may be reduced.

Then, the powder aggregate having a packing fraction of 40% or smaller is fired under the above condition. The furnace used for firing may be heated by metal resistance heating or graphite resistance heating, and carbon is preferably used as the high temperature part of the furnace because the firing temperature is high and nitrogen is employed as the firing atmosphere. For firing, a sintering method in which no mechanical pressure is applied from the outside, such as normal pressure sintering and gas pressure sintering, is desirable for performing firing while maintaining the bulk density in a predetermined range.

When the powder aggregate obtained by firing is solidified hard, the aggregate is ground by using a mill usually employed in the factory, such as a ball mill, jet mill, and the like. Among them, the particle size is controlled most easily in ball milling. A silicon nitride sintered body or a sialon sintered body is preferable as the materials of balls and pots for the present purpose. Grinding is continued until an averaged particle diameter of 20 μm or smaller is reached. Particularly desirable averaged particle diameter is at least 20 nm and does not exceed 10 μm. When the averaged particle diameter exceeds 20 μm, the fluidity of the powder and dispersion into resin deteriorate, and emission intensity may become nonuniform from part to part when a light emitting device is built by combining the phosphor with a light-emitting device. When the averaged particle diameter is equal to or less than 20 nm, it becomes more difficult to handle the phosphor powder. If an objective particle diameter is not obtained by grinding alone, classification may be used in combination with the grinding. Sieving, air classification, and settling in a liquid may be employed as means of classification.

Here, in this specification, the mean particle diameter is defined as follows. In the measurement by the sedimentation method, the particle diameter is defined as the diameter of an equivalent sphere having the same sedimentation rate, and in the laser scattering method, it is defined as the diameter of an equivalent sphere having the same scattering characteristics. Further, the distribution of particle diameters is called the particle size (particle diameter) distribution. In the particle diameter distribution, a specified particle diameter is defined as the mean particle diameter D50 when the total mass of powder particles having diameters larger than the specified particle diameter is 50% of the total mass of the entire powder body. These definitions and terms are well known to the one skilled in the art and are set out in various documents such as JIS Z 8901 "Powder Body for Test and Particle for Test" and the first chapter of "Basic Physical Properties of Powder" edited by The Society of Powder Technology, Japan (ISBN4-526-05544-1). In the present invention, a specimen was dispersed in water in which sodium hexamethaphosphate was added as a dispersing agent. Then, the volume-converted integrated frequency distribution of the particle diameters was measured by using a laser scattering-type measurement instrument. Here, the volume-converted distribution is identical to the weight-converted distribution. The particle diameter corresponding to that at 50% in the integrated (cumulative) frequency distribution was obtained and defined as the mean particle diameter D50. It should be noted that, in the following part of this specification, the mean particle diameter is based on the median value (D50) of the particle size distribution measured with a particle size distribution measurement means by the above-mentioned laser scattering method. As for the means for determining the mean particle diameter, various kinds, have been developed and the development is continuing, so that the value measured by a newly developed means may differ slightly. However, it should be understood that the meaning and significance of the mean particle diameter itself is definite, and the means for measuring the mean particle diameter is not necessarily limited to the above-mentioned means.

Further, by washing the fired compound with a solvent for dissolving these inorganic compounds after the firing, the contents of the inorganic compounds such as glass phases, a second phase, or impurity phases other than the phosphor contained in the reaction product is reduced so that the brightness of the phosphor is improved. As such solvent, water and aqueous solution of an acid can be used. As the aqueous solution of the acid, sulfuric acid, hydrochloric acid, nitric acid, hydrofluoric acid, a mixture of organic acid and hydrofluoric acid, or the like can be used. In particular, the mixture of sulfuric acid and hydrofluoric acid achieves a large effect. This processing is quite effective with respect to a reaction product fired at a high temperature wherein the inorganic compounds yielding a liquid phase at the firing temperature or lower have been added to the product in advance.

Although fine phosphor powder is obtained through the above processes, heat treatment is effective in order to further improve the brightness. For this purpose, the powder after firing or the powder after particle size adjustment by pulverization and classification can be subject to heat treatment at a temperature that is at least 1000° C. and less than the firing temperature. At a temperature lower than 1000° C., the effect of removing surface defects is relatively low. A temperature higher than or equal to the firing temperature is undesirable because particles of the ground phosphor aggregate again with each other. The atmosphere suitable for heat treatment depends on phosphor compositions. As for an atmosphere suitable for the heat treatment, a mixed atmosphere including one or more gases selected from among nitrogen, air, ammonia, and hydrogen can be used. Among these, a nitrogen atmosphere is particularly preferable since this atmosphere exhibits a pronounced effect of removing defects.

The thus-obtained phosphor of the present invention is characterized by high brightness of a visible light emission as compared with an ordinary oxide phosphor and sialon phosphor of the prior art. A phosphor of a specific composition, in particular, is characterized by emission of blue light having a peak in the range that is 430 nm or higher and 480 nm or lower and hence is suitable for lighting devices and image display devices. Further, the phosphor of the present invention does not deteriorate even when exposed to high temperatures and thus has superior thermal resistance, and excels in a long-term stability in an oxidizing atmosphere and humid environment.

The lighting device of the present invention is configured with at least a light-emitting source and the phosphor of the present invention. Acceptable lighting devices include, for example, the LED lighting device and the fluorescent lamp. The LED lighting device can be manufactured using the phosphor of the present invention and a publicly known method described, for example in Japanese Patent Application Publication No. H05-152609, Japanese Patent Application Publication No. H07-99345, or Japanese Patent No. 2927279. In this case, a light-emitting source which emits light with a wavelength of 330 to 420 nm is preferred and in particular an LED or LD emission device emitting ultraviolet (or violet) light with a wavelength of 330 to 420 nm is especially preferred.

Such a light-emitting device includes those devices comprised of a nitride semiconductor such as GaN, InGaN, or the like, which can constitute a light-emitting source for emitting light with a predetermined wavelength by adjusting the composition thereof.

A lighting device which emits light of a desired color can be constructed using a phosphor having other light-emitting properties in combination with the phosphor of the present invention rather than using the phosphor of the present invention alone. As an example thereof can be mentioned a combination of: an LED or LD light-emitting device which emits ultraviolet light of 330 to 420 nm; a yellow phosphor which is excited by the light of this wavelength so as to emit light having an emission peak at a wavelength range that is 550 nm or longer and is 600 nm or shorter; and the blue phosphor of the present invention. For such yellow phosphor, α-sialon:$Eu^{2+}$ disclosed in Japanese Patent Application Publication No. 2002-363554 and $(Y, Gd)_2(Al, Ga)_5O_{12}$: Ce disclosed in Japanese Patent Application Publication No. H09-218149 may be utilized. In such configuration, when the ultraviolet light emitted by the LED or LD irradiates the phosphors, light of two colors: blue and yellow is emitted so as to produce a white color lighting device by mixing these two colors.

As another example, a combination of: an ultraviolet LED or LD light-emitting device which emits light of 330 to 420 nm; a green phosphor which is excited by the light of this wavelength and emits light having an emission peak in the range that is 520 nm or longer and is 550 nm or shorter; a red phosphor which emits light having an emission peak in the range that is 600 nm or longer and is 700 nm or shorter; and the blue phosphor of the present invention an be mentioned. For such green phosphor, for example, β-sialon: $Eu^{2+}$ described in Japanese patent application publication No. 2005-255895 can be utilized, and for the red phosphor, $CaSiAlN_3$: $Eu^{2+}$ described in WO2005/052087 pamphlet can also be utilized. In such configuration, when the ultraviolet light emitted by the LED or LD irradiates the phosphors, light of three colors: red, green, and blue is emitted so as to produce a white color lighting device by mixing these three colors.

In another way, an LED or LD light-emitting device which emits ultraviolet light of 330 to 420 nm; a green phosphor which is excited by the light of this wavelength and emits light having an emission peak in a wavelength range that is 520 nm or longer and is 550 nm or shorter; a yellow phosphor which is excited by the light of this wavelength and emits light having an emission peak in a wavelength range that is 550 nm or longer and is 600 nm or shorter; a red phosphor which is excited by the light of this wavelength and emits light having an emission peak in a wavelength range that is 600 nm or longer and is 700 nm or shorter; and the blue phosphor of the present invention can be combined. For such green phosphor, for example, β-sialon: $Eu^{2+}$ described in Japanese patent application publication No. 2005-255895 can be utilized, for such yellow phosphor, α-sialon: $Eu^{2+}$ described in Japanese patent application publication No. 2002-363554 and $(Y, Gd)_2(Al, Ga)_5O_{12}$: Ce described in Japanese patent application publication No. H09-218149 can be utilized, and for such red phosphor, $CaSiAlN_3$: Eu described in WO2005/052087 pamphlet can also be utilized. In such configuration, when the ultraviolet light emitted by the LED or LD irradiates the phosphors, light of four colors: blue, green, yellow, and red is emitted so as to produce a white color or a reddish bulb color lighting device by mixing these colors.

The image display device of the present invention comprises: at least an excitation source and the phosphor of the present invention, and includes a vacuum fluorescent display (VFD), a field emission display (FED or SED), a plasma display panel (PDP), a cathode-ray tube (CRT), or the like. It has been confirmed that the phosphor of the present invention emits light by excitation of 100 to 190 nm vacuum ultraviolet light, 190 to 380 nm ultraviolet light, an electron beam, or the like, and the above image display devices are constructed by combining these excitation sources and the phosphor of the present invention.

Since the phosphor of the present application is excellent in the excitation efficiency of the electron beam, it is suitable for the application to the VFD, FED, SED, and CRT, in which the acceleration voltage of the electron beam is 10 V or higher and 30 kV or lower.

The FED is an image display device in which luminescence is produced by bombarding the phosphor applied on the anode with electrons emitted and accelerated from the field emission cathode and it is required that the luminescence be made with an acceleration voltage not exceeding 5 kV so that the display device will be improved in the luminescence performance by combining the phosphor of the present invention.

The present invention is described in more detail with examples to be shown below. However, these examples are disclosed only to facilitate the understanding of the present invention with ease. Therefore, the present invention is not limited to these examples.

Example 1

As powdery raw materials, silicon nitride powder having a mean particle diameter of 0.5 μm, oxygen content of 0.93 wt %, and α-type content of 92% (Ube Industries, Ltd., SN-E10 grade), aluminum nitride powder having a specific surface area of 3.3 m²/g and oxygen content of 0.85% (Tokuyama Corp, F grade), and europium oxide powder of 99.9% purity (Shin-etsu Chemical Co., Ltd.) were used.

In order to obtain a starting raw composition represented by the compositional formula $Eu_aA_bAl_cSi_dO_eN_fC_g$ where a=0.0024, b=0, c=0.464, d=0.0286, e=0.0024, f=0.5026, and g=0, 6.433 mass % of silicon nitride power, 91.641 mass % of aluminum nitride power, and 1.926 mass % of europium oxide power were weighed and blended with a mortar and pestle made of a silicon nitride sintered compact, and then the resultant mixture was passed through a sieve with an opening of 125 μm to obtain a powder aggregate having excellent fluidity. Here, the mixture power contained 0.85 mass % or more of impurity oxygen derived from the raw material powders. By allowing the powder aggregate to spontaneously to fall into a boron nitride crucible having a diameter of 20 mm and a height of 20 mm, a bulk density was about 15 vol %. The bulk density was calculated from the weight of the powder aggregate charged into the crucible, the internal volume of the crucible, and the true density of the powder. Next, the crucible was set into a graphite resistance heating-type electric furnace. Firing operations were conducted as follows. First, the firing atmosphere was evacuated with a diffusion pump, and then heated from the room temperature to 800° C. at a rate of 500° C./h. Thereafter, gaseous nitrogen having a purity of 99.9995 vol % was introduced at 800° C. to set the gas pressure to 1 MPa, and the temperature was raised to 1950° C. at a rate of 500° C./h and maintained at the temperature for 24 hours.

The synthesized sample of 25 mg was weighed in a platinum crucible, sodium carbonate of 0.75 g and boric acid of 0.3 g were added into the crucible, and then the mixture was heated to melt. Then, the mixture to which hydrochloric acid and water were added was measured by the ICP (Inductively Coupled Plasma) such that the cation elements were quantitatively measured. And, the synthesized samples of 10 mg were poured in a tin capsule and a nickel basket such that the oxygen content was measured quantitatively by the infrared absorption method and the nitrogen content was measured quantitatively by the thermal conductivity method with the TC436 nitrogen-oxygen analyzing device manufactured by LECO Corporation. With these measurements, the synthesized sample had the composition of $Eu_{0.0013}Al_{0.484}Si_{0.016}O_{0.0005}N_{0.4982}$ and the oxygen content was reduced to 0.04±0.01 mass %.

The synthesized samples were ground with a mortar and pestle made of silicon nitride, and subject to the powder X-ray diffraction measurements (XRD) using the Cu Kα characteristic X-ray. As the result, it was confirmed that a crystal of the wurtzite-type AlN crystal structure was generated by the obtained chart as shown in FIG. 1, but no other crystal phases were detected.

Figure 2:
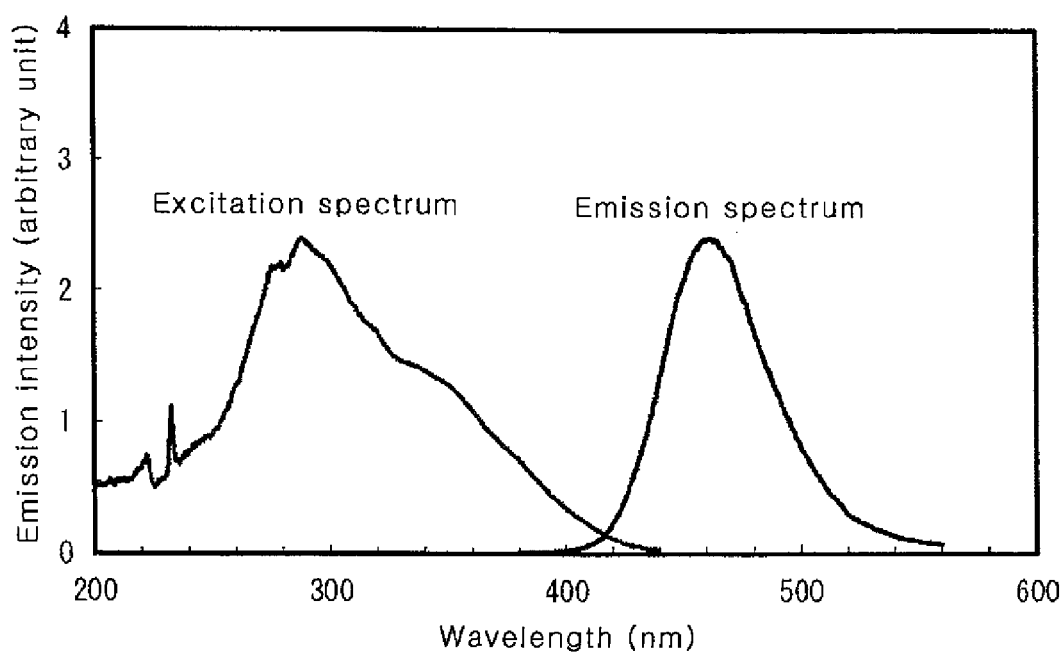
FIG. 2 shows an excitation spectrum and an emission spectrum by fluorescence measurement of Example 1.

As a result of irradiating the thus-obtained powder sample with a lamp which emitted light of a wavelength of 365 nm, a blue color light emission was confirmed. The excitation spectrum and emission spectrum of the powder sample were measured using a spectrophotofluorometer. FIG. 2 shows the excitation spectrum and emission spectrum by the photoluminescence measurement. It was found to be a phosphor to emit blue light having the peak of the emission spectrum at the wavelength of 463 nm upon the excitation at the peak wavelength of the excitation spectrum and the peak of the excitation spectrum was at the wavelength of 287 nm. Here, the excitation spectrum and emission spectrum are shown after their intensities are normalized by the emission intensity of a commercially available YAG: CE phosphor (manufactured by Kasei Optonix, Ltd., P46Y3), which is equal to 1 when exited with the wavelength of 450 nm.

Figure 3:
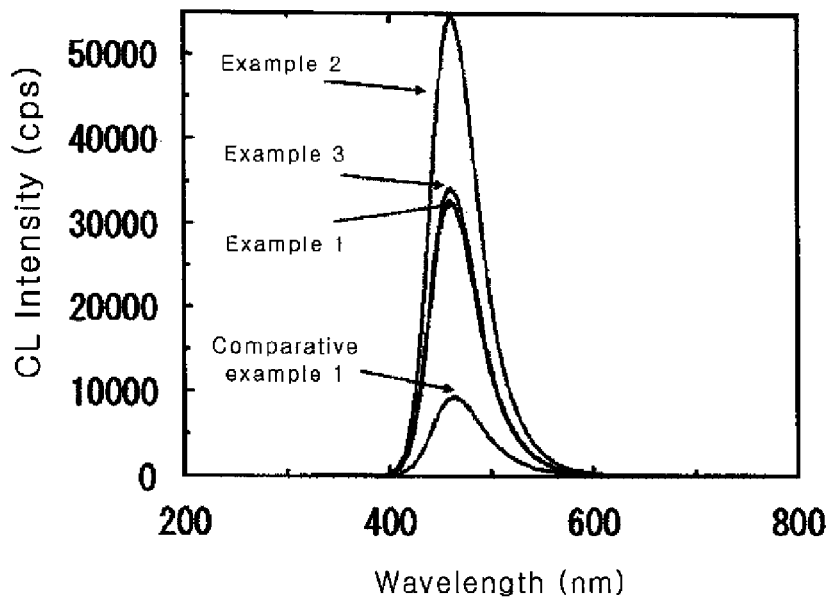
FIG. 3 shows a cathodoluminescence spectrum by the electron beam excitation of Examples 1 to 3 and Comparative example 1.

Luminescence characteristics (cathodoluminescence, CL) under electron beam irradiation were observed by SEM equipped with a CL detector, and CL images were evaluated. This apparatus shows where light is emitted and which wavelength the emitted light has by obtaining photographic images constituting two-dimensional information by detecting visible light generated upon irradiation of the electron beam. FIG. 3 shows a CL spectrum with an acceleration voltage of 500 V. It was confirmed by emission spectrum observation that this phosphor emits blue light upon excitation of the electron beam.

The atomic geometry of the obtained powder was observed using a scanning transmission electron microscopy manufactured by Hitachi, Ltd. (Model HD-2300C). The sample had a structure of lamination in the C-axis direction of the wurtzite-type AlN crystal, and the structure of lamination was formed by stacking $Al(O, N)_4$ tetrahedron layers and layers constituted of a skeleton including Eu.

Example 2

As powdery raw materials, silicon nitride powder having a mean particle diameter of 0.5 μm, oxygen content of 0.93 wt %, and α-type content of 92% (Ube Industries, Ltd., SN-E10 grade), aluminum nitride powder having a specific surface area of 3.3 m²/g and oxygen content of 0.85% (Tokuyama Corp, F grade), and europium oxide powder of 99.9% purity (Shin-etsu Chemical Co., Ltd.) were used.

In order to obtain a starting raw composition represented by the compositional formula $Eu_aA_bAl_cSi_dO_eN_fC_g$ where a=0.0024, b=0, c=0.464, d=0.0286, e=0.0024, f=0.5026, and g=0, 6.433 mass % of silicon nitride power, 91.641 mass % of aluminum nitride power, and 1.926 mass % of europium oxide power were weighed and blended with a mortar and pestle made of a silicon nitride sintered compact, and then the resultant mixture was passed through a sieve with an opening of 125 μm to obtain a powder aggregate having excellent fluidity. Here, the mixture power contained 0.85 mass % or more of impurity oxygen derived from the raw material powders. By allowing the powder aggregate to spontaneously to fall into a boron nitride crucible having a diameter of 20 mm and a height of 20 mm, a bulk density was about 15 vol %. The bulk density was calculated from the weight of the powder aggregate charged into the crucible, the internal volume of the crucible, and the true density of the powder. Next, the crucible was set into a graphite resistance heating-type electric furnace. Firing operations were conducted as follows. First, the firing atmosphere was evacuated with a diffusion pump, and then heated from the room temperature to 800° C. at a rate of 500° C./h. Thereafter, gaseous nitrogen having a purity of 99.9995 vol % was introduced at 800° C. to set the gas pressure to 1 MPa, and the temperature was raised to 2050° C. at a rate of 500° C./h and maintained at the temperature for 4 hours.

The synthesized sample of 25 mg was weighed in a platinum crucible, sodium carbonate of 0.75 g and boric acid of 0.3 g were added into the crucible, and then the mixture was heated to melt. Then, the mixture to which hydrochloric acid and water were added was measured by the ICP (Inductively Coupled Plasma) such that the cation elements were quantitatively measured. And, the synthesized samples of 10 mg were poured in a tin capsule and a nickel basket such that the oxygen content was measured quantitatively by the infrared absorption method and the nitrogen content was measured quantitatively by the thermal conductivity method with the TC436 nitrogen-oxygen analyzing device manufactured by LECO Corporation. With these measurements, the synthesized sample had the composition of $Eu_{0.0014}Al_{0.479}Si_{0.0154}O_{0.0010}N_{0.5032}$ and the oxygen content was reduced to 0.08±0.01 mass %.

The synthesized samples were ground with the mortar and pestle made of silicon nitride, and subject to the powder X-ray diffraction measurements (XRD) using the Cu Kα characteristic X-ray. As the result, it was confirmed that a crystal of the wurtzite-type AlN crystal structure was generated by the obtained chart as shown in FIG. 1, but no other crystal phases were detected.

Figure 4:
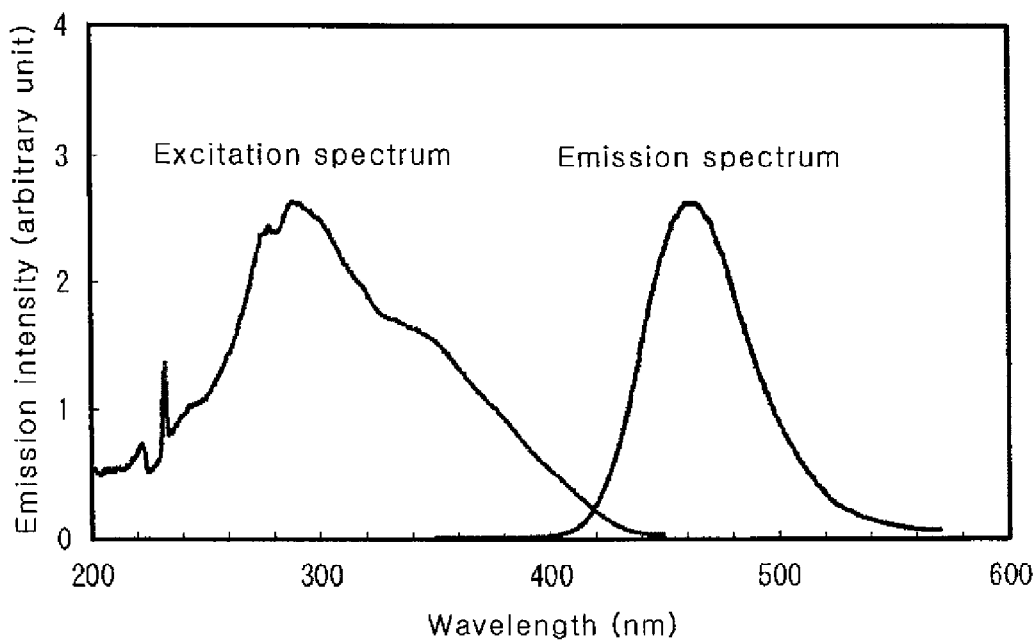
FIG. 4 shows an excitation spectrum and an emission spectrum by fluorescence measurement of Example 2.

As a result of irradiating the thus-obtained powder sample with a lamp which emitted light of a wavelength of 365 nm, a blue color light emission was confirmed. The excitation spectrum and emission spectrum of the powder sample were measured using a spectrophotofluorometer. FIG. 4 shows the excitation spectrum and emission spectrum by the photoluminescence measurement. It was found to be a phosphor to emit blue light having the peak of the emission spectrum at the wavelength of 462 nm upon the excitation at the peak wavelength of the excitation spectrum and the peak of the excitation spectrum was at the wavelength of 290 nm.

The luminescence characteristics (cathodoluminescence, CL) under the electron beam irradiation were observed by the SEM equipped with the CL detector in a similar manner as described with Example 1, and the CL images were evaluated. FIG. 3 shows a CL spectrum with an acceleration voltage of 500 V. It was confirmed by the emission spectrum observation that this phosphor emits blue light upon excitation of the electron beam.

Example 3

As powdery raw materials, silicon nitride powder having a mean particle diameter of 0.5 μm, oxygen content of 0.93 wt %, and α-type content of 92% (Ube Industries, Ltd., SN-E10 grade), aluminum nitride powder having a specific surface area of 3.3 m²/g and oxygen content of 0.85% (Tokuyama Corp, F grade), zinc oxide powder of 99.9% purity (Kojundo Chemical Laboratory Co., Ltd., special grade), and europium oxide powder of 99.9% purity (Shin-etsu Chemical Co., Ltd.) were used.

In order to obtain a starting raw composition represented by the compositional formula $Eu_aZn_bAl_cSi_dO_eN_fC_g$ where a=0.0024, b=0.004762, c=0.45952, d=0.02857, e=0.007143, f=0.497604, and g=0, 6.368 mass % of silicon nitride power, 89.787 mass % of aluminum nitride power, 2.000 mass % of europium oxide power, and 1.85 mass % of zinc oxide powder were weighed and blended with a mortar and pestle made of a silicon nitride sintered compact, and then the resultant mixture was passed through a sieve with an opening of 125 μm to obtain a powder aggregate having excellent fluidity. Here, the mixture power contained 0.85 mass % or more of impurity oxygen derived from the raw material powders. By allowing the powder aggregate to spontaneously to fall into a boron nitride crucible having a diameter of 20 mm and a height of 20 mm, a bulk density was about 15 vol %. The bulk density was calculated from the weight of the powder aggregate charged into the crucible, the internal volume of the crucible, and the true density of the powder. Next, the crucible was set into a graphite resistance heating-type electric furnace. Firing operations were conducted as follows. First, the firing atmosphere was evacuated with a diffusion pump, and then heated from the room temperature to 800° C. at a rate of 500° C./h. Thereafter, gaseous nitrogen having a purity of 99.9995 vol % was introduced at 800° C. to set the gas pressure to 1 MPa, and the temperature was raised to 2050° C. at a rate of 500° C./h and maintained at the temperature for 4 hours.

The synthesized sample of 25 mg was weighed in a platinum crucible, sodium carbonate of 0.75 g and boric acid of 0.3 g were added into the crucible, and then the mixture was heated to melt. Then, the mixture to which hydrochloric acid and water were added was measured by the ICP (Inductively Coupled Plasma) such that the cation elements were quantitatively measured. And, the synthesized samples of 10 mg were poured in a tin capsule and a nickel basket such that the oxygen content was measured quantitatively by the infrared absorption method and the nitrogen content was measured quantitatively by the thermal conductivity method with the TC436 nitrogen-oxygen analyzing device manufactured by LECO Corporation. With these measurements, the synthesized sample had the composition of $Eu_{0.0008}Al_{0.488}Si_{0.0103}O_{0.0006}N_{0.500}$ and the oxygen content was reduced to 0.05±0.02 mass %. Here, the reason why the total of the indexes of the compositional formula of the synthesized sample is not equal to 1 may be considered that, although the added zinc volatilized during the firing and the remaining amount decreased to 0.01 mass % as low as the detection limit, a trace amount of Zn was still present.

The synthesized samples were ground with the mortar and pestle made of silicon nitride, and subject to the powder X-ray diffraction measurements (XRD) using the Cu Kα characteristic X-ray. As the result, it was confirmed that a crystal of the wurtzite-type AlN crystal structure was generated by the obtained chart as shown in FIG. 1, but no other crystal phases were detected.

Figure 5:
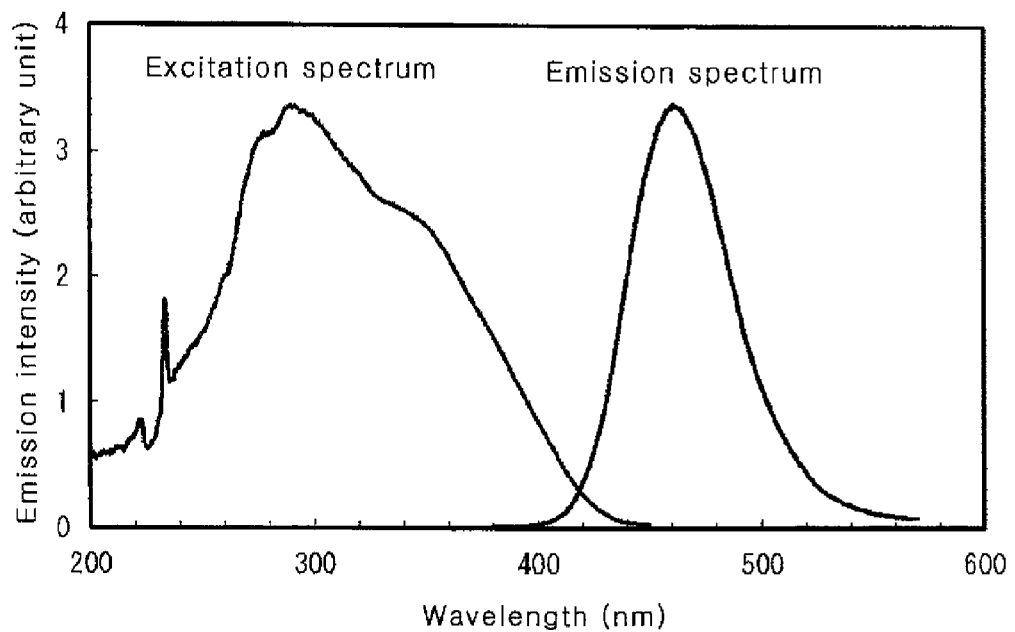
FIG. 5 shows an excitation spectrum and an emission spectrum by fluorescence measurement of Example 3.

As a result of irradiating the thus-obtained powder sample with a lamp which emitted light of a wavelength of 365 nm, a blue color light emission was confirmed. The excitation spectrum and emission spectrum of the powder sample were measured using a spectrophotofluorometer. FIG. 5 shows the excitation spectrum and emission spectrum by the photoluminescence measurement. It was found to be a phosphor to emit blue light having the peak of the emission spectrum at the wavelength of 464 nm upon the excitation at the peak wavelength of the excitation spectrum and the peak of the excitation spectrum was at the wavelength of 288 nm.

The luminescence characteristics (cathodoluminescence, CL) under the electron beam irradiation were observed by the SEM equipped with the CL detector in a similar manner as described with Example 1, and the CL images were evaluated. FIG. 3 shows a CL spectrum with an acceleration voltage of 500 V. It was confirmed by the emission spectrum observation that this phosphor emits blue light upon excitation of the electron beam.

Comparative Example 1

The procedure is the same as Example 1 except that the holding time at 1950° C. was shortened to 4 hours, and therefore, an explanation is omitted.

In a similar manner as described with Example 1, the ICP analysis was performed and constituent cation elements were quantified. Further, in a similar manner as describe with Example 1, oxygen was quantified by the infrared absorption method and nitrogen was quantified by the thermal conductivity method. These measurements showed that a synthesized sample composition was $Eu_{0.0008}Al_{0.488}Si_{0.0103}O_{0.0006}N_{0.5003}$, the oxygen content was 0.43±0.01 mass %, and the content of oxygen was lowered from the feed amount, but was still above 0.4 mass %. Example 1 and Comparative example 1 showed that the oxygen content decreases effectively by making the firing time longer, even if the composition of the starting raw material and the firing temperature are identical.

The synthesized samples were ground with the mortar and pestle made of silicon nitride, and subject to the powder X-ray diffraction measurements (XRD) using the Cu Kα characteristic X-ray. As the result, it was confirmed that a crystal of the wurtzite-type AlN crystal structure was generated by the obtained chart as shown in FIG. 1, but no other crystal phases were detected.

Figure 6:
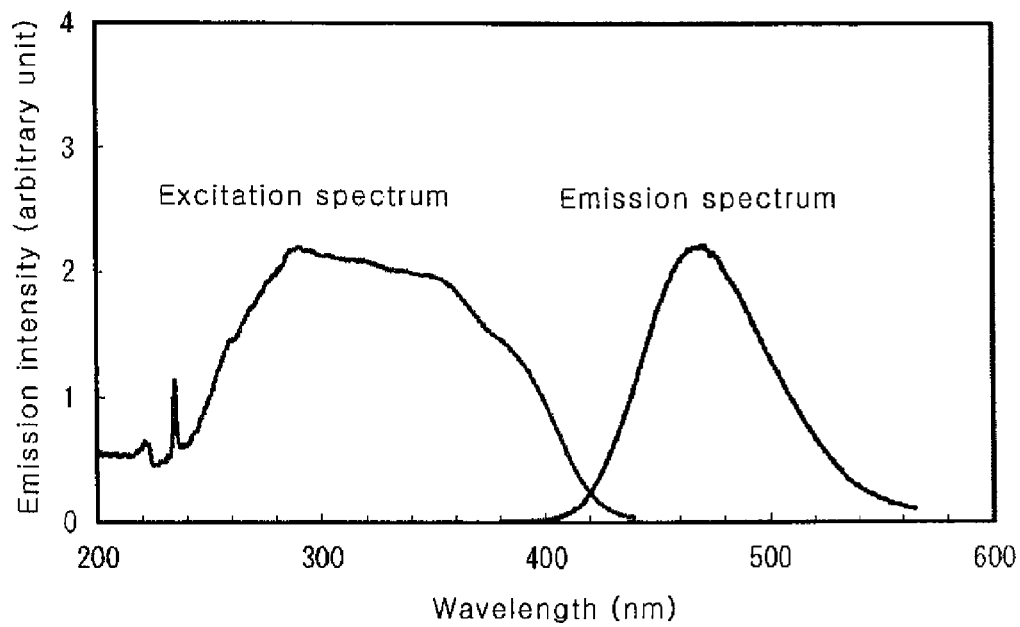
FIG. 6 shows an excitation spectrum and an emission spectrum by fluorescence measurement of Comparative example 1.

As a result of irradiating the thus-obtained powder sample with a lamp which emitted light of a wavelength of 365 nm, a blue color light emission was confirmed. The excitation spectrum and emission spectrum of the powder sample were measured using the spectrophotofluorometer. FIG. 6 shows the excitation spectrum and emission spectrum by the photoluminescence measurement. It was found to be a phosphor to emit blue light having the peak of the emission spectrum at the wavelength of 467 nm upon the excitation at the peak wavelength of the excitation spectrum and the peak of the excitation spectrum was at the wavelength of 288 nm.

The luminescence characteristics (cathodoluminescence, CL) under the electron beam irradiation were observed by the SEM equipped with the CL detector in a similar manner as described with Example 1, and the CL images were evaluated. FIG. 3 shows a CL spectrum with an acceleration voltage of 500 V. It was confirmed by the emission spectrum observation that this phosphor emits blue light upon excitation of the electron beam. It was also confirmed by the CL spectrum that the emission wavelength was a longer wavelength and the color purity of the blue color was not so good.

Example 4

As powdery raw materials, silicon carbide powder having a mean particle diameter of 0.5 μm (Sumitomo Osaka Cement Co., Ltd.), aluminum nitride powder having a specific surface area of 3.3 m$^2$/g and oxygen content of 0.85% (Tokuyama Corp, F grade), and europium oxide powder of 99.9% purity (Shin-etsu Chemical Co., Ltd.) were used.

In order to obtain a starting raw composition represented by the compositional formula $Eu_aA_bAl_cSi_dO_eN_fC_g$ where a=0.001, b=0, c=0.468909, d=0.030091, e=0.001, f=0.468909, and g=0.030091, 5.597 mass % of silicon carbide power, 93.175 mass % of aluminum nitride power, and 1.23 mass % of europium oxide power were weighed and blended with a mortar and pestle made of a silicon nitride sintered compact, and then the resultant mixture was passed through a sieve with an opening of 125 μm to obtain a powder aggregate having excellent fluidity. Firing operations were conducted as follows. First, the firing atmosphere was evacuated with a diffusion pump, and then heated from the room temperature to 800° C. at a rate of 500° C./h. Thereafter, gaseous nitrogen having a purity of 99.9995 vol % was introduced at 800° C. to set the gas pressure to 1 MPa, and the temperature was raised to 2000° C. at a rate of 500° C./h and maintained at the temperature for 8 hours.

As a result of measurement of the synthesized sample performed with a similar way as described with Example 1, it was confirmed that the amount of oxygen was 0.4 mass % or less. Next, the synthesized sample was ground with the mortar and pestle made of silicon nitride, and subject to the powder X-ray diffraction measurements (XRD) using the Cu Kα characteristic X-ray. As the result, it was confirmed that a crystal of the wurtzite-type AlN crystal structure was generated by the obtained chart, but no other crystal phases were detected.

It was confirmed that the phosphor emitted blue light as a result that the thus-obtained powder was irradiated by the lamp emitting the light of the wavelength of 365.

The luminescence characteristics (cathodoluminescence, CL) under the electron beam irradiation were observed by the SEM equipped with the CL detector in a similar manner as described with Example 1, and it was confirmed that this phosphor was excited by the electron beam to exhibit blue emission. The excitation spectrum and emission spectrum of this powder was measured with a fluorescence spectrophotometer. As a result, this powder was found to be a phosphor to emit blue light having the peak of the emission spectrum at the wavelength of 465 nm upon the excitation at the peak wavelength of the excitation spectrum and the peak of the excitation spectrum was at the wavelength of 292 nm. As mentioned above, it was found that, according to Examples 1 to 4, the obtained phosphor could be a blue phosphor having an emission peak wavelength that is a short wavelength with excellent color purity by reducing the amount of oxygen contained in the phosphor to 0.4 mass % or less. It is advantageous to utilize such phosphor in designing the device since a peak position of the emission spectrum of the phosphor can be adjusted to shift toward the short wavelength side by the order of nanometer by controlling the oxygen content as described above.

Example 5

Figure 7:
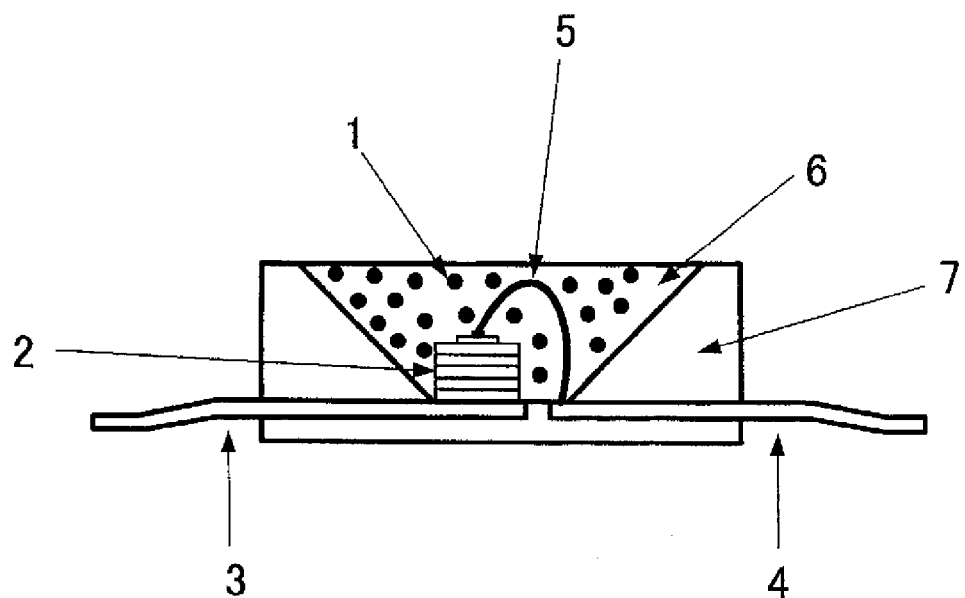
FIG. 7 is a general diagram showing a lighting device (LED lighting device) according to the present invention.

Next, a lighting device utilizing the phosphor of the present invention is explained. FIG. 7 is a schematic structural diagram of a white LED to serve as a lighting device. The mixture phosphor 1 containing a nitride phosphor of the present invention and other phosphors, and a near ultraviolet LED chip 2 of 380 nm to serve as a light-emitting device are utilized. The phosphor of Example 1 of the present invention and a yellow phosphor of Ca-α-sialon: Eu having the compositional formula $Ca_{0.75}Eu_{0.25}Si_{8.625}Al_{3.375}O_{1.125}N_{14.875}$ are dispersed in a resin layer 6 to form a mixture phosphor 1, which is configured to cover an LED chip 2 so as to be positioned in a container 7. When an electric current passes through conductive terminals 3 and 4, the electric current is supplied to the LED chip 2 via a wire bond 5. Then, the LED chip 2 emits light of 380 nm, which excites the phosphor mixture 1 comprising the yellow phosphor and the blue phosphor to emit yellow and blue light, respectively. Thus, the device works as a lighting device which emits white light generated by mixing the yellow and blue light. This lighting device is characterized by high emission efficiency.

Example 6

With reference to FIG. 7, a lighting device formed with another design of combination different from the above combination is explained. First, the ultraviolet LED chip 2 of 380 nm is utilized as the light-emitting element. The phosphor according to Example 1 of the present invention, the green phosphor described in Example 1 (β-sialon: Eu) of Patent Document 3, and a red phosphor ($CaSiAlN_3$: Eu) described in Example 1 of Patent Document 6 are dispersed in the resin layer 6 to be the mixture phosphor 1. Then, the mixture phosphor 1 is disposed on the ultraviolet LED chip 2. When an electric current is supplied to the conductive terminals 3 and 4, the LED chip 2 emits light of 380 nm, which excites the blue phosphor, the green phosphor, and the red phosphor such that the light of blue, green, and red colors is emitted from the phosphors. Thus, the lighting device works as a lighting device emitting the white light by mixing the three colors of light.

Example 7

Figure 8:
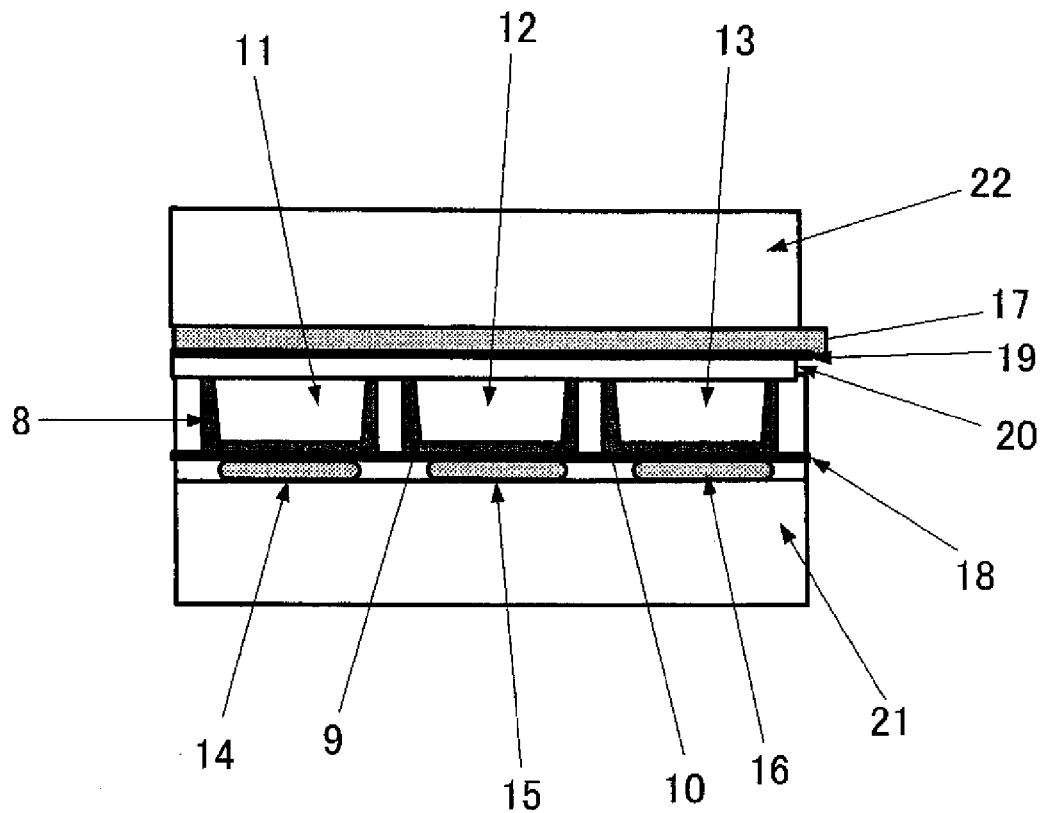
FIG. 8 is a general diagram showing an image display device (plasma display panel) according to the present invention.

Next, an example of designing an image display device using the nitride phosphor of the present invention is explained. FIG. 8 is a schematic diagram showing the principle of a plasma display panel as an image display device. A red phosphor ($Y(PV)O_4$: Eu) 8, the green phosphor ($Zn_2SiO_4$: Mn) 9, and a blue phosphor 10 of Example 1 of the present invention are applied to the internal surface of respective ultraviolet-emitting cells 11, 12, and 13. When an electric current is supplied to electrodes 14, 15, 16, and 17, vacuum ultraviolet radiation is generated by Xe discharge in the cells, and the phosphors are excited by this radiation to emit visible light of red, green, and blue colors. The emitted light is observed from the outside via a protection layer 20, a dielectric layer 19, and a glass substrate 22, and the device functions as an image display.

Example 8

Figure 9:
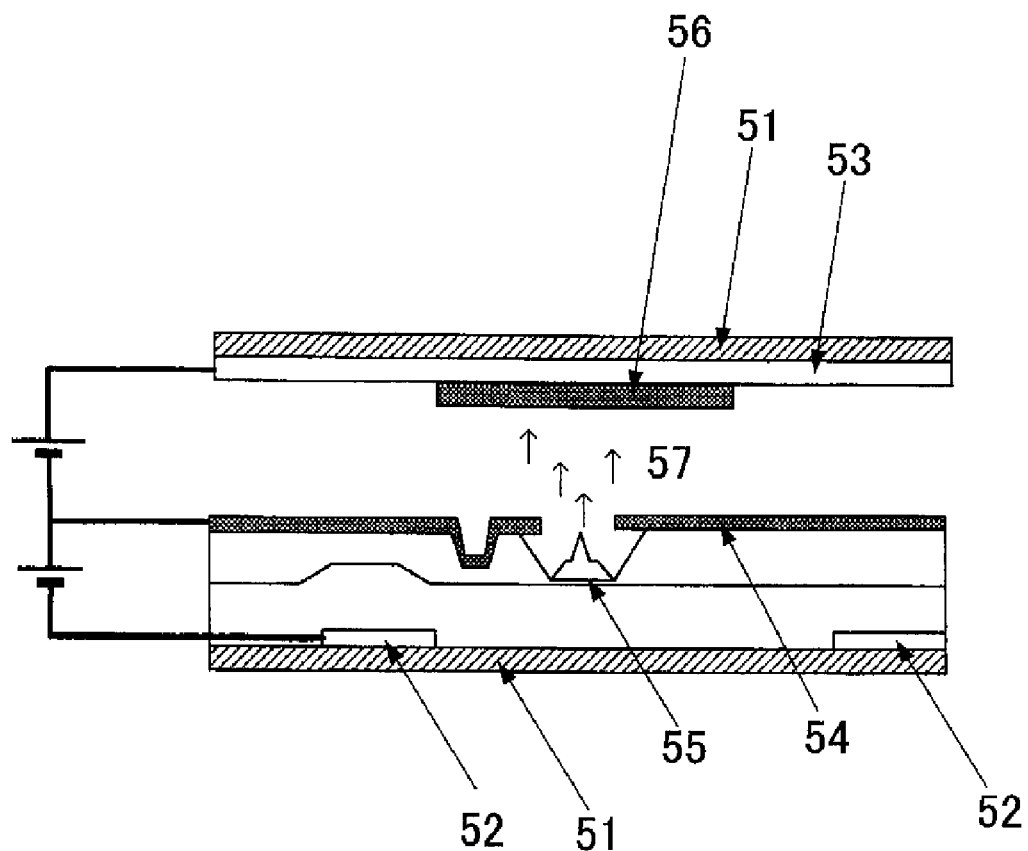
FIG. 9 is a general diagram showing an image display device (field emission display) according to the present invention.

FIG. 9 is a schematic diagram showing the principle of a field emission display panel as an image display device. The blue phosphor 56 of Example 1 of the present invention is applied to the internal surface of an anode 53. By applying voltage between a cathode 52 and a gate 54, electrons 57 are emitted from an emitter 55. The electrons 57 are accelerated by the voltage between the anode 53 and cathode 52, and impinge on the phosphor 56 to excite the phosphor to emit light. The entire structure is protected by a glass plate 51. The drawing shows a single light emission cell comprising one emitter and one phosphor. However, an actual display emitting a variety of colors is built by arranging a large number of green and red cells besides blue cells. Although the phosphors used for green and red cells are not particularly specified, phosphors which show high brightness under low-voltage electron beams are preferable.

INDUSTRIAL APPLICABILITY

The nitride phosphor of the present invention exhibits a blue emission different from the emission of the conventional sialon phosphor, and shows small deterioration in the brightness when exposed to an excitation source. Hence this nitride phosphor is used suitably for a VFD, an FED, a PDP, a CRT, a white LED, and the like. In the future, it is expected that the phosphor of the present invention will be extensively utilized in various kinds of display devices using electron beam as the excitation source, which will contribute to the development of the industry.

While the foregoing describes the present invention in relation to illustrations and examples, it is understood that it is not intended to limit the scope of the invention to the illustrations and examples described herein. On the contrary, it is intended to cover all alternative modifications and equivalents that may be included in the spirit and the scope of the invention as defined by the appended claims.

What is claimed is:

1. A phosphor comprising: an inorganic crystal having a crystal structure of an AlN crystal, an AlN polytype crystal, or an AlN solid solution crystal, wherein at least divalent europium is solid-solved in the inorganic crystal, an amount of oxygen in the inorganic crystal is at least 0.03 mass % and not exceeding 0.4 mass %, and an emission color thereof satisfies (x, y) values of $0 \leqq x \leqq 0.15$ and $0.05 \leqq y \leqq 0.1$ on a CIE chromaticity coordinate.

2. The phosphor according to claim 1 wherein the inorganic crystal has a wurtzite-type AlN crystal structure, a crystal structure selected from $2H^\delta$; 27R; 21R; 12H; 15R; and 8H, or a crystal structure having an $Al(O, N)_4$ tetrahedron skeleton therein.

3. The phosphor according to claim 1, wherein the AlN polytype crystal comprises: a layer constituted of an $Al(O, N)_4$ tetrahedron skeleton and a layer constituted of a skeleton including Eu.

4. The phosphor according to claim 1, wherein silicon is solid-solved in the inorganic crystal.

5. The phosphor according to claim 4, wherein carbon is solid-solved in the inorganic crystal.

6. The phosphor according to claim 1, wherein the inorganic crystal is a solid solution crystal of the AlN crystal or the AlN polytype crystal, and a SiC crystal.

7. The phosphor according to claim 1, wherein a metal element A (where A is one or two or more elements selected from Mg, Ca, Sr, Ba, Zn, and Cd) is solid-solved in the inorganic crystal.

8. A phosphor comprising: an inorganic crystal having a crystal structure of an AlN crystal, an AlN polytype crystal, or an AlN solid solution crystal, wherein at least divalent europium is solid-solved in the inorganic crystal, an amount of oxygen in the inorganic crystal is not exceeding 0.4 mass %, and the inorganic crystal is expressed by a compositional formula $Eu_a A_b Al_c Si_d O_e N_f C_g$ (where A is one or two or more kinds of elements selected from Mg, Ca, Sr, Ba, Zn, and Cd; and a+b+c+d+e+f+g=1), and wherein:

$0.00001 \leqq a \leqq 0.1$ (i);

$0 \leqq b \leqq 0.2$ (ii);

$0.4 \leqq c \leqq 0.55$ (iii);

$0.005 \leqq d \leqq 0.2$ (iv);

$0.001 \leqq e \leqq 0.05$ (v);

$0.3 \leqq f \leqq 0.55$ (vi); and $0 \leqq g \leqq 0.02$ (vii).

9. The phosphor according to claim 1, wherein the excitation source is visible light or ultraviolet ray having a wavelength that is at least 100 nm and not exceeding 420 nm, or an electron beam.

10. A method of manufacturing the phosphor recited in claim 1, comprising the step of: firing a raw material mixture comprising europium, aluminum, silicon if necessary, and an element A if necessary (where A is one or two or more kinds of elements selected from Mg, Ca, Sr, Ba, Zn, and Cd) in a nitrogen atmosphere in a temperature range of $15 \times 10^{2\circ}$ C. or higher and $25 \times 10^{2\circ}$ C. or lower until an oxygen content becomes at least 0.03 mass % and not exceeding 0.4 mass %, and an emission color thereof satisfies (x, y) values of $0 \leqq x \leqq 0.15$ and $0.05 \leqq y \leqq 0.1$ on a CIE chromaticity coordinate.

11. The method of manufacturing the phosphor according to claim 10, comprising the step of: filling a raw material mixture comprising europium metal, europium oxide, europium carbonate, europium nitride, europium fluoride, europium chloride, europium oxynitride, or a combination thereof; aluminum nitride; silicon nitride if necessary; and element A metal, element A oxide, element A carbonate, element A nitride, element A fluoride, element A chloride, element A oxynitride, or a combination thereof (where A is one or two or more kinds of elements selected from Mg, Ca, Sr, Ba, Zn, and Cd) if necessary in a container with a bulk density thereof not exceeding 40%, and then firing the thus-filled mixture in the nitrogen atmosphere that is at least 0.1 MPa and not exceeding 100 MPa in the temperature range that is at least $15 \times 10^{2\circ}$ C. and not exceeding $25 \times 10^{2\circ}$ C.

12. The method of manufacturing the phosphor according to claim 10, wherein a compound containing silicon carbide or carbon is further added to the raw material mixture.

13. A lighting device utilizing the phosphor as recited in claim 1, comprising: an emission source emitting light having a wavelength of 330 nm to 420 nm as an excitation source of the phosphor.

14. An image display device utilizing the phosphor as recited in claim 1 as a display element, wherein the image display device has an excitation source to cause the phosphor to emit light.

15. The image display device according to claim 14, being any one of a fluorescent display tube (VFD), a field emission display (FED or SED), and a cathode-ray tube (CRT), wherein the excitation source is an electron beam whose acceleration voltage is from 10 V or higher to 30 kV or lower.

* * * * *